(12) United States Patent
Ikeya et al.

(10) Patent No.: US 7,605,191 B2
(45) Date of Patent: Oct. 20, 2009

(54) PHOTOSENSITIVE RESIN, PHOTOSENSITIVE COMPOSITION AND PHOTO-CROSSLINKED STRUCTURE

(75) Inventors: Takeshi Ikeya, Chiba (JP); Toru Shibuya, Chiba (JP); Kana Miyazaki, Chiba (JP)

(73) Assignee: Toyo Gosei Co., Ltd., Ichikawa-Shi (JP)

( * ) Notice: Subject to any disclaimer, the term of this patent is extended or adjusted under 35 U.S.C. 154(b) by 387 days.

(21) Appl. No.: 11/393,678

(22) Filed: Mar. 31, 2006

(65) Prior Publication Data
US 2006/0235103 A1    Oct. 19, 2006

(30) Foreign Application Priority Data
Mar. 31, 2005  (JP) .............................. 2005-104768
Mar. 31, 2005  (JP) .............................. 2005-104769

(51) Int. Cl.
*B01F 3/04*  (2006.01)

(52) U.S. Cl. ........................ 522/173; 522/134; 522/136; 522/139; 522/140; 522/150; 522/152; 522/153; 522/174; 522/175; 522/176; 522/177; 522/178; 532/100; 552/1; 552/6; 552/7; 552/8

(58) Field of Classification Search ................. 522/134, 522/136, 174–178, 150–153, 139, 140; 552/1, 552/6–8; 532/100
See application file for complete search history.

(56) References Cited

U.S. PATENT DOCUMENTS 6,861,456 B2 *  3/2005  Shibuya et al. .............. 522/173

FOREIGN PATENT DOCUMENTS

JP          9-103481          4/1997

(Continued)

OTHER PUBLICATIONS

Japanese Patent Application Laid-open No. 10-161307 published on Jun. 19, 1998 and an English translation of the abstract.

(Continued)

*Primary Examiner*—Mark Eashoo
*Assistant Examiner*—Jessica Paul
(74) *Attorney, Agent, or Firm*—Young & Thompson

(57) ABSTRACT

The invention provides a photosensitive resin which can readily form, through photo-crosslinking, a surface coating which has hydrophilicity and high bioadaptability; a photosensitive composition containing the photosensitive resin; and a photo-crosslinked structure obtained from the photosensitive composition.

The photosensitive resin is represented by the following formula (1):

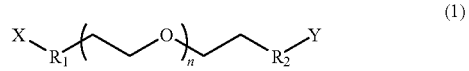

(1)

(wherein n represents a mean polymerization degree and is 5 or more; $R_1$ and $R_2$, which may be identical to or different from each other, each represent an alkylene group, an arylene group, an oxyalkylene group, or a single bond; each of X and Y represents a photosensitive unit represented by the following formula (2):

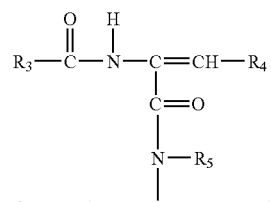

(2)

or either one of X and Y represents a photosensitive unit represented by the above formula (2) and the other represents an amino group; $R_3$ represents a group selected from among the groups represented by the following formula set (3):

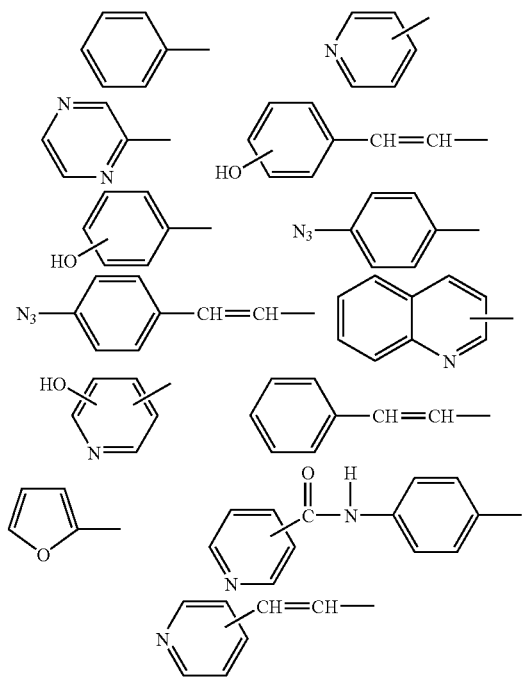

(3)

$R_4$ represents a group selected from among the groups represented by the following formula set (4):

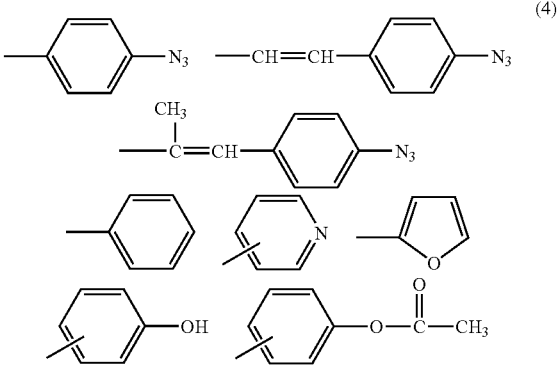

(4)

at least one of $R_3$ and $R_4$ has at least one azido group; and $R_5$ represents a hydrogen atom, an alkyl group, an acetal-group-containing alkyl group, an aryl group, an aralkyl group, or a substituent containing a base-forming nitrogen atom).

3 Claims, 2 Drawing Sheets

FOREIGN PATENT DOCUMENTS

| | | |
|---|---|---|
| JP | 2003-292477 | 10/2003 |
| JP | 2004-531390 | 10/2004 |
| WO | WO 03/000433 | 1/2003 |

OTHER PUBLICATIONS

Japanese Patent Application Laid-open No. 2001-226360 published on Aug. 21, 2001 and an English translation of the abstract.

Japanese Patent Application Laid-open No. 10-310769 published on Nov. 24, 1998 and an English translation of the abstract.

Japanese Patent Application Laid-open No. 53-12984 published on Feb. 6, 1978 and its corresponding GB1580959.

Poly (ethylene glycol) Activation and Its Application as Carrier in Drug Delivery and as Support in Organic Synthesis, Zou Yaobang et al., World Sci-Tech R & D, Apr. 2003, 25 (2) 63-68.

Chinese Patent Office issued a Chinese Office Action dated Jun. 19, 2009, Application No. 2006800009387.

* cited by examiner

Example 26
Before immersion

Example 26
80 Hours after immersion in
phosphate buffer (pH 7.4)

Example 26
24 Hours after immersion in
acetone

Example 43
Before immersion

Example 43
80 Hours after immersion in
phosphate buffer (pH 7.4)

Example 43
24 Hours after immersion in
acetone

Example 85
Immersion in phosphate buffer

Example 85
Immersion in acetone

Example 101
Immersion in phosphate buffer

Example 101
Immersion in acetone

PHOTOSENSITIVE RESIN, PHOTOSENSITIVE COMPOSITION AND PHOTO-CROSSLINKED STRUCTURE

The entire disclosure of Japanese Patent Application Nos. 2005-104768 filed on Mar. 31, 2005, and 2005-104769 filed on Mar. 31, 2005, is expressly incorporated by reference herein.

BACKGROUND OF THE INVENTION

1. Field of the Invention

The present invention relates to a photosensitive resin, a photosensitive composition, and a photo-crosslinked structure obtained from the composition. More particularly, the invention relates to a photo-crosslinked structure which has a higher-order structure and which allows an arbitrary site of a substrate surface to be hydrophilic.

2. Description of Related Art

Conventionally, a variety of photosensitive resins having a hydrophilic polymer serving as a backbone and photosensitive compositions containing such a photosensitive resin have been proposed. Among them, an example of such resins which have ever been developed is a photosensitive resin having a saponified polyvinyl acetate moiety in a backbone (see Patent Document 1). Although the saponified polyvinyl acetate is water-soluble and applicable to a substrate in the form of water-based aqueous solution, a photo-crosslinked structure thereof has such high water resistance that allows the structure to be produced through development with water. However, the photo-crosslinked structure produced from the photosensitive resin has a surface having a static contact angle—an index for hydrophilicity—as high as about 50°, which is unsatisfactory from the viewpoint of imparting hydrophilicity to a substrate surface.

Patent Document 1 also discloses photosensitive compounds; i.e., a polyoxypropylene-polyoxyethylene copolymer having an amino group at each end and a polyoxyethyleneamine (Jeffamine series, products of Huntsuman Corporation), with a photosensitive group having been introduced to each end of these polymers. However, photosensitive compounds produced from polyoxypropyleneamine-polyoxyethylene copolymer having an amino group at each end (Jeffamine ED-600) or polyoxyethyleneamine (Jeffamine EDR-148) have considerably poor solubility in water, and photo-crosslinked structures obtained from the compounds fail to attain sufficient film strength and to have a stable hydrophilic surface.

In order to control adsorption of a physiologically active substance or a similar substance on an interface between the substance and a structure such as a medical device, there has been proposed provision of a surface having excellent bioadaptability through formation of a hydrophilic surface by use of a photo-crosslinked structure obtained from a photosensitive composition containing a hydrophilic polymer having an azido group (see Patent Document 2). However, photosensitive compositions disclosed in Patent Document 2 produced from an acrylamide derivative or a similar substance serving as a hydrophilic polymer having an azido group fail to attain sufficient film strength and to have a stable hydrophilic surface.

[Patent Document 1] Japanese Patent Application Laid-Open (kokai) No. 2003-292477 (paragraphs including [0013] and [0046])

[Patent Document 2] Japanese Patent Application Laid-Open (kokai) No. 9-103481 (paragraphs including [0044])

SUMMARY OF THE INVENTION

Under such circumstances, an object of the present invention is to provide a photosensitive resin which can readily provide, through photo-crosslinking, a surface coating which has hydrophilicity and high bioadaptability. Another object of the invention is to provide a photosensitive composition containing the photosensitive resin. Still another object of the invention is to provide a photo-crosslinked structure obtained from the photosensitive composition.

Accordingly, in a first mode of the present invention attaining the above objects, there is provided a photosensitive resin represented by the following formula (1):

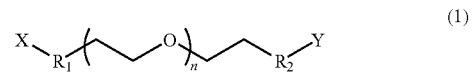

(wherein n represents a mean polymerization degree and is 5 or more; $R_1$ and $R_2$, which may be identical to or different from each other, each represent an alkylene group, an arylene group, an oxyalkylene group, or a single bond; each of X and Y represents a photosensitive unit represented by the following formula (2):

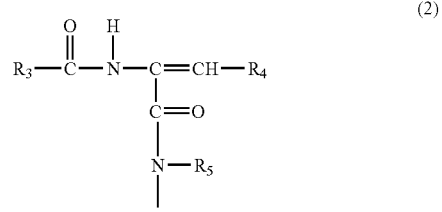

or either one of X and Y represents a photosensitive unit represented by the above formula (2) and the other represents an amino group; $R_3$ represents a group selected from among the groups represented by the following formula set (3):

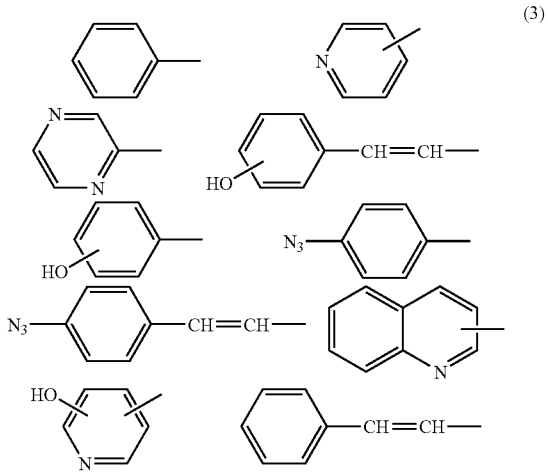

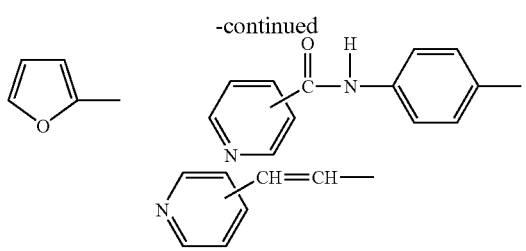

R₄ represents a group selected from among the groups represented by the following formula set (4):

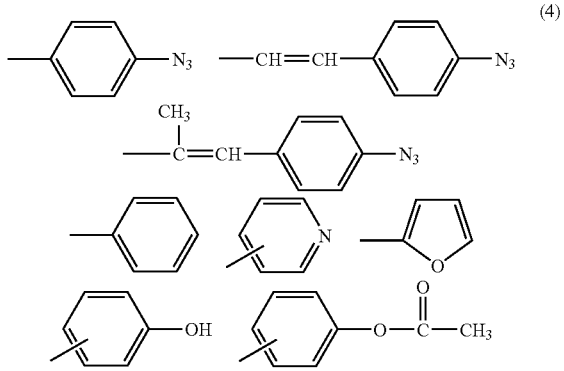

at least one of $R_3$ and $R_4$ has at least one azido group; and $R_5$ represents a hydrogen atom, an alkyl group, an acetal-group-containing alkyl group, an aryl group, an aralkyl group, or a substituent containing a base-forming nitrogen atom).

A second mode of the present invention is directed to a specific embodiment of the photosensitive resin according to the first mode, wherein each of $R_1$ and $R_2$ represents a methylene group or a single bond, X and Y represent the same photosensitive unit represented by the aforementioned formula (2), $R_3$ represents a group represented by the following formula (5), and $R_4$ represents a group represented by the following formula (6).

$$-CH=CH-\!\!\!\!\bigcirc\!\!\!\!-N_3, \quad (5)$$

$$\bigcirc\!\!\!\!\!/\!\!\!\!N \quad (6)$$

A third mode of the present invention is directed to a specific embodiment of the photosensitive resin according to the first or second mode, wherein the mean polymerization degree n is 20 to 230.

A fourth mode of the present invention provides a photosensitive composition, which is a solution containing a photosensitive resin as recited in any of the first to third modes dissolved in a solvent.

A fifth mode of the present invention is directed to a specific embodiment of the photosensitive composition according to the fourth mode, wherein the composition comprises spherical microstructures which are formed from the photosensitive resin and which have a particle size of 2 nm to 5 μm.

A sixth mode of the present invention is directed to a specific embodiment of the photosensitive composition according to the fourth or fifth mode, which has a photosensitive resin concentration of 0.1 to 30 wt. %.

A seventh mode of the present invention is directed to a specific embodiment of the photosensitive composition according to any of the fourth to sixth modes, wherein the solvent is water, an organic solvent compatible with water, or a mixture thereof.

An eighth mode of the present invention is directed to a specific embodiment of the photosensitive composition according to any of the fourth to seventh modes, which has a pH of 0 to 10.

A ninth mode of the present invention is directed to a specific embodiment of the photosensitive composition, wherein the composition further comprises a surfactant, and the surfactant and the photosensitive compound form spherical microstructures having a particle size of 2 nm to 10 μm.

A tenth mode of the present invention provides a photo-crosslinked structure, which is produced through irradiation of a photosensitive composition as recited in any of the fourth to ninth modes with light.

An eleventh mode of the present invention provides a photo-crosslinked structure, which is produced through applying a photosensitive composition as recited in any of the fourth to ninth modes onto a substrate and irradiating the composition with light, and which is fixed to the substrate.

A twelfth mode of the present invention is directed to a specific embodiment of the photo-crosslinked structure according to the tenth or eleventh mode, which has a surface exhibiting a static contact angle of 35° or less with respect to water.

The novel photosensitive resin of the present invention can be dissolved in a solvent to form a photosensitive composition, and when irradiated with light, the photosensitive composition forms a photo-crosslinked structure having a surface maintaining hydrophylicity. The photo-crosslinked structure can be suitably employed as a gelling material, a surface-improvement material, or a material which imparts bioadaptability to, for example, a surface of a medical device. Thus, the photo-crosslinked structure can effectively provides a medical device.

DETAILED DESCRIPTION OF PREFERRED EMBODIMENTS

Figure 1A:
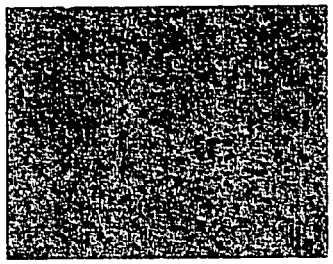
FIGS. 1A to 1F show surface conditions of some photo-crosslinked structure samples of the present invention before and after the solvent-exposure test.

The photosensitive resin the of the present invention is a compound represented by the above formula (1), in which a photosensitive group is linked to each end of the oxyalkylene group backbone. In formula (1), the mean polymerization degree n is 5 or more, preferably 20 to 230. When the mean polymerization degree n is less than 5, the resin has poor water-solubility, and it is difficult to maintain hydrophilicity for a photo-crosslinked structure obtained through irradiation of the photosensitive resin (hereinafter referred to simply as "photo-crosslinked structure"). Particularly when n is 20 to 230, the formed photo-crosslinked structure exhibits such a high hydrophilicity that a surface of the structure maintains hydrophilicity, and the structure has molecular chain flexibility and excluded volume which are suitable for exhibiting bioadaptability. When n is greater than 230, the relative amount (by mole) of photosensitive groups in a molecule decreases, thereby reducing photo-crosslinking efficiency and lowering mechanical strength of the formed photo-crosslinked structure.

Each of $R_1$ and $R_2$ represents an alkylene group, an arylene group, an oxyalkylene group, or a single bond, preferably a C1 to C20 alkylene group, an arylene group, an oxyalkylene group, or a single bond, more preferably a C1 to C6 alkylene group, an arylene group, an oxyalkylene group, or a single bond, most preferably a single bond or a methylene group.

At least one of X and Y may be a photosensitive unit represented by the above formula (2). In other words, each of X and Y may represent a photosensitive unit represented by the above formula (2), or either one of X and Y may represent a photosensitive unit represented by the above formula (2). Particularly preferably, X and Y have the same structure represented by formula (2). In the case where either one of X and Y is a photosensitive unit represented by formula (2), the other is an amino group. In formula (2), $R_3$ is a group selected from among the above formula set (3), and $R_4$ is a group selected from among the above formula set (4). At least one of $R_3$ and $R_4$ has at least one azido group. R5 represents a hydrogen atom, an alkyl group, an acetal-group-containing alkyl group, an aryl group, an aralkyl group, or a substituent containing a base-forming nitrogen atom, preferably a hydrogen atom, a C1 to C6 alkyl group, an acetal-group-containing alkyl group, an aryl group, an aralkyl group, or a substituent containing a base-forming nitrogen atom. Notably, the group represented by formula (2) may have the same structure as a monovalent group derived through removal of substituent Z from a photosensitive unit represented by formula (1) disclosed in Patent Document 1. Specific examples of groups represented by formula (2) include structures (2)-1 to (2)-15 shown in Table 1. These structures are represented by formula (2) in which substituents $R_3$ to $R_5$ are represented by those listed in Table 1. For example, structures (2)-1 to (2)-4 each have an azido group as $R_4$, and structure (2)-5 has azido groups as $R_3$ and $R_4$. Particularly preferably, $R_3$ is represented by the above formula (5), and $R_4$ is represented by formula (6).

TABLE 1

| | $R_3$ | $R_4$ | $R_5$ |
|---|---|---|---|
| (2)-1 | 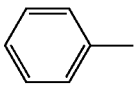 |  | H |
| (2)-2 | 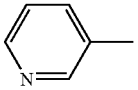 | 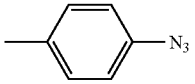 | H |
| (2)-3 | 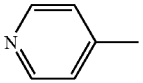 | 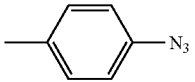 | H |
| (2)-4 | 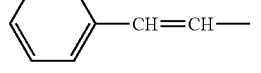 | 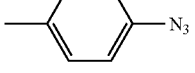 | H |
| (2)-5 | 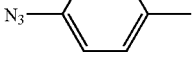 | 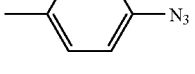 | H |
| (2)-6 | 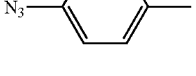 | 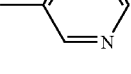 | H |
| (2)-7 | 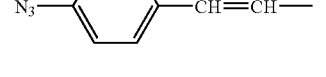 | 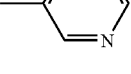 | H |
| (2)-8 | 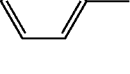 | 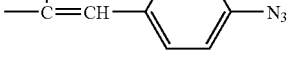 | H |
| (2)-9 | 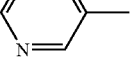 | 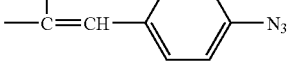 | H |

TABLE 1-continued

| | R₃ | R₄ | R₅ |
|---|---|---|---|
| (2)-10 | phenyl | —C₆H₄—N₃ | —CH₂—phenyl |
| (2)-11 | 3-pyridyl | —C₆H₄—N₃ | —CH₂—phenyl |
| (2)-12 | 2-pyrazinyl | —C₆H₄—N₃ | —CH₂—phenyl |
| (2)-13 | 2-furyl | —C(CH₃)=CH—C₆H₄—N₃ | H |
| (2)-14 | 3-pyridyl-C(=O)—NH—C₆H₄— | —C₆H₄—N₃ | H |
| (2)-15 | 3-pyridyl-C(=O)—NH—C₆H₄— | —C(CH₃)=CH—C₆H₄—N₃ | H |

No particular limitation is imposed on the method of producing the photosensitive resin of the present invention represented by the above formula (1). For example, the resin may be produced by reacting polyethylene glycol having end amino groups with a compound which forms a structure represented by the above formula (2) through bonding with the amino groups.

In the production of a photosensitive resin represented by formula (1) in which each of R₁ and R₂ is a single bond, polyethylene glycol-diamine or a similar compound may be employed as a polyethylene glycol having end amino groups. In the production of a photosensitive resin represented by formula (1) in which each of R₁ and R₂ is any of the aforementioned groups, polyethylene glycol-dipropylamine or a similar compound may be employed as polyethylene glycol having end groups to each having an amino group bonded via R₁ or R₂

Examples of the compound which forms a structure represented by the above formula (2) through bonding with amino groups of polyethylene glycol having end amino groups include 4-((4-azidophenyl)methylene)-2-phenyl-1,3-oxazolin-5-one (photo-functional compound 1), 4-((4-azidophenyl)methylene-2-(3-pyridyl)-1,3-oxazolin-5-one) (photo-functional compound 2), 2-(4-azidophenyl)-4-(3-pyridylmethylene)-1,3-oxazolin-5-one (photo-functional compound 3), 2-(2-(4-azidophenyl)vinyl)-4-(3-pyridylmethylene)-1,3-oxazolin-5-one (photo-functional compound 4), 4-(4-azido-β-methyl-cinnamylidene)-2-phenyl-2-oxazolin-5-one (photo-functional compound 5), and 4-(4-azido-β-methyl-cinnamylidene)-2-(3-pyridyl)-2-oxazolin-5-one (photo-functional compound 6), which are photosensitive units disclosed in Patent Document 1. These photo-functional compounds may be produced through a method disclosed in Patent Document 1.

In the production of a photosensitive resin represented by formula (1) in which X and Y have the same structure represented by formula (2) (i.e., both end groups having the same structure represented by formula (2)), a compound which forms a structure represented by the above formula (2) through bonding with amino groups may be reacted with polyethylene glycol having end amino groups such that the amount of the compound is twice or more the equivalent by mole of the polyethylene glycol having end amino groups. When polyethylene glycol having a hydroxyl group or a methoxy group serving as one end and an amino group serving as the other end is employed, a photosensitive resin represented by formula (1) having a structure represented by formula (2) exclusively at one end can be produced. When a photosensitive resin having a structure represented by formula (2) at each end and a photosensitive resin having a structure represented by formula (2) at one end are produced at an arbitrary ratio, the corresponding compounds may be reacted in the required amounts (equivalent by mole).

The photosensitive composition of the present invention is a solution produced by dissolving a photosensitive resin represented by the above formula (1) in a solvent. No particular limitation is imposed on the type of the solvent for forming the photosensitive composition so long as the solvent can dissolve the photosensitive resin. The solvent is preferably water, an organic solvent compatible with water, or a mixture thereof. Examples of the organic solvent compatible with water include ketones such as acetone, alcohols such as methanol, acetonitrile, tetrahydrofuran, dimethyl sulfoxide, dimethylformamide, and dimethylacetamide.

No particular limitation is imposed on the amount of photosensitive resin incorporated into the photosensitive composition of the present invention. However, formation of spherical microstructures, which will be described hereinbelow, depends on component concentrations of the photosensitive composition. In order to produce a photosensitive composition containing spherical microstructures, the photosensitive resin concentration is preferably 0.1 to 30 wt. %. The photosensitive resins may be used singly or in combination of two or more species.

The photosensitive resin contained in the photosensitive composition of the present invention has a hydrophobic photosensitive unit represented by formula (2) at either one end or both ends of a hydrophilic polyethylene glycol chain. Therefore, the resin can form spherical microstructures such as micelles. Since the photosensitive resin effectively forms spherical microstructures particularly in water, the following mechanism is conceived. Specifically, photosensitive units which are hydrophobic end units having an amido moiety form a core by the mediation of hydrophobic interaction or hydrogen bonds, and polyethylene glycol units, which are more hydrophilic than the end units, surround the core, to thereby form a shell, whereby a polymer micelle structure is provided. Thus, the photosensitive composition of the present invention is preferably formed from a solvent selected from among water, an organic solvent compatible with water, and a mixture thereof, since the aforementioned interaction is effectively attained to form spherical microstructures.

In such a photosensitive composition, a portion of photosensitive resin forming spherical microstructures and free photosensitive resin not forming spherical microstructures are conceived to be in an equilibrium state. The equilibrium is shifted depending on the hydrophobicity of a hydrophobic group represented by formula (2) and introduced at an end of the photosensitive resin or other factors. Therefore, in some cases, the entirety of the photosensitive resin present in the solution forms spherical microstructures, or in other cases, only a portion of the photosensitive resin forms spherical microstructures, and the other portion is present in the free form. In any case, at least a portion of the photosensitive resin contained in the photosensitive composition of the present invention preferably forms spherical microstructures.

When spherical microstructures are formed in the photosensitive composition, the spherical microstructures may be detected by means of, for example, a dynamic light scattering measurement apparatus or a particle size distribution measurement apparatus. Through measuring dynamic light scattering, spherical microstructures having a particle size of about 1 nm to about 5 µm can be detected, and the spherical microstructure content of the composition can be determined. In one method for determining particle size of spherical microstructures, a dynamic light scattering measurement apparatus (HPPS Zetasizer Nano Series, product of Malvern) is employed. When the solvent is water, a measurement cell made of poly(methyl methacrylate) is used, whereas when the solvent is an organic solvent, a measurement cell made of quartz is used. The measurement conditions are 25° C. for 90 seconds, and the obtained dynamic light scattering values are averaged.

Now will be described in detail the case in which the photosensitive composition of the present invention has a photosensitive resin concentration of about 0.1 to about 30 wt. %. When the concentration falls within the above range, the photosensitive resin forms spherical microstructures having a particle size of 2 nm to 5 µm. In this case, at least one particle size peak (usually three particle size peaks) are detected. Among these peaks, the first peak observed at a diameter of about 2 to about 50 nm is conceived to be attributed to a micelle structure. The second peak observed at a diameter of about 50 nm to about 1 µm is conceived to be attributed to a relatively large structure in which some end photosensitive units of the photosensitive resin crosslink cores of micells. The third peak observed at a diameter of 1 µm or more is conceived to be attributed to a larger structure in which hydrophobic cores are aggregated. The photosensitive composition of the present invention preferably contains at least spherical microstructures having a mean particle size of 2 to 50 nm. In the case of a photosensitive composition exhibiting only one particle size peak as detected through dynamic light scattering measurement, the mean particle size is about 2 to about 50 nm.

When the composition contains a photosensitive resin having a hydrophobic photosensitive unit at each chain end, the first peak is conceived to be attributed to a flower micelle structure (primary structure), in which both ends of respective chains aggregate facing the miccelle core via hydrophobic interaction or hydrogen bonds, and each hydrophilic polyethylene glycol chain linking two ends assumes loop-like structure and is solvated. The second peak is conceived to be attributed to a crosslinked structure (secondary structure), in which a polyethylene glycol chain crosslinks different flower micelles (first peak) at two hydrophobic ends. The third peak is conceived to be attributed to an aggregate structure (tertiary structure), in which cores are aggregated via hydrophobic interaction, causing macroscopic phase separation. When the photosensitive composition is in the form of dilute solution, the primary structure is predominant. As the concentration of the solution increases, secondary and tertiary structures are conceived to increase.

In the case where large spherical microstructures having a mean particle size of 1 µm or more and possibly assuming a tertiary structure are present in a solution, a photo-crosslinked structure formed from the solution through light irradiation may form a phase separation structure having, in some cases, a size of some tens µm. Although the as formed photo-crosslinked structure may be employed, such a large phase separation structure is preferably removed depending on the application of the photo-crosslinked structure. One reason for removal of the phase separation structure is that a phase separation structure having a size greater than light wavelength and variation in refractive index in the photo-crosslinked structure cause light scattering and turbidity, resulting in considerable drop in transparency. Therefore, large spherical microstructures such as a tertiary structure may be removed from the photosensitive composition through filtration. Filtration may be performed through a generally known filtration method, and examples of the method include pressurized filtration and reduced-pressure filtration. No particular limitation is imposed on the type of filtration membrane, so long as the membrane can filter out the tertiary structure. Examples include a cellulose acetate filtration membrane.

In some cases, the photosensitive unit of the photosensitive resin contained in the photosensitive composition has an ionic dissociating group. In an aqueous photosensitive composition containing such a photosensitive resin, pH of the solution is a particularly important factor, since the photosensitive unit may be in a dissociated or non-dissociated state depending on the pH of the solution surrounding the unit, causing considerable change in local hydrophilicity. In other words, conceivably, when the photosensitive unit is in the dissociated state, formability of spherical microstructures by the mediation of hydrophobic interaction is reduced, whereas when the photosensitive unit is in the non-dissociated state, formability of spherical microstructures via hydrophobic interaction is enhanced. As a result, diameter of spherical microstructures, wettability of the photosensitive composition to the substrate, photosensitivity of the composition upon irradiation, and mechanical strength of the formed photo-crosslinked structure considerably depend on the pH. The photosensitive composition of the present invention is preferably employed at a pH of 0 to 10, particularly preferably at a pH of 1 to 7.

The photosensitive composition of the present invention may further contain a surfactant. When the composition contains a surfactant, the surfactant and a photosensitive compound form spherical microstructure particles having a particle size of 2 nm to 10 μm in the solvent, the particle being formed of a single molecule or a plularity of self-assembled molecules. Examples of such spherical microstructures include a micelle structure. When the surfactant-containing photosensitive composition is photo-crosslinked, the spherical microstructures or a structure in which the spherical microstructures are aggregated and rearranged is maintained. Therefore, a surface of the crosslinked product is always hydrophilic, and the product can be suitably employed as a gelling material or a surface-improving material; for example, a surface-improving material which imparts bioadaptability to a surface of a medical device. Thus, the photo-crosslinked structure can effectively provide a medical device.

When the photosensitive composition contains a surfactant, the photosensitive resin represented by formula (1) above may be altered to a photosensitive compound having oxyethylene repeating units and at least one photo-crosslinkable functional group, which compound is more generic than the photosensitive resin, so as to attain the same effect. No particular limitation is imposed on the bonding site of the oxyethylene repeating unit moiety with respect to the photo-crosslinkable functional group. However, the photo-crosslinkable functional group is preferably bonded to an end of the oxyethylene repeating unit moiety. In addition, a molecular chain serving as a spacer may be inserted between the oxyethylene repeating unit moiety and the photo-crosslinkable functional group. Alternatively, the oxyethylene repeating unit moiety and the photo-crosslinkable functional group may be directly bonded to each other. As used herein, the photo-crosslinkable functional group refers to a chemical moiety having a functional group which can form a chemical bond through light irradiation. The effective photosensitive site may be present in the photo-crosslinkable functional group or in a photosensitive component incorporated into the photosensitive composition such as a sensitizer, a photopolymerization initiator, or a photo-acid-generator. In the latter case, the photo-crosslinkable functional group must have a reactive site with respect to a species released from other photosensitive components after light irradiation. Among the photosensitive functional groups contained in the photo-crosslinkable functional group or photosensitive components, an azido group is particularly preferred.

Examples of the surfactant include anionic surfactants, cationic surfactants, nonionic surfactants, and polymer micelle material formed from a block copolymer including hydrophilic-hydrophobic units. Of these, nonionic surfactants are preferred, with nonionic surfactants having oxyethylene repeating units and no photo-crosslinkable photosensitive group being particularly preferred. This is because when the photo-crosslinked structure is formed in the presence of a nonionic surfactant, aggregates of spherical microstructures are always surrounded by polyethylene glycol chains, whereby a hydrophilic, bioadaptable surface is provided. Non-limitative examples of such nonionic surfactants having oxyethylene repeating units and no photo-crosslinkable photosensitive group include polyethylene glycol oligomers and polymers having a linear-chain alkyl group such as 2-ethyl-hexyl, lauryl, or stearyl at either one or both ends. These surfactants may be used singly or in combination of two or more species. No particular limitation is imposed on the surfactant concentration. Preferably, for example, the surfactant concentration is 0.01 to 30 wt. %, and the total (surfactant and photosensitive compound) concentration is 0.1 to 50 wt. %.

The photosensitive composition of the present invention may further contain additives, so long as the additives do not inhibit formation of a photo-crosslinked structure. Examples of the additives include pH regulators for the photosensitive composition; i.e., acids such as mineral acids and organic acids and bases such as sodium hydroxide, potassium hydroxide, and aqueous ammonia. Furthermore, a salt for regulating salt (ionic) strength such as sodium chloride, a buffer for stabilizing pH such as phosphate buffer, and a defoaming agent may also be added to the composition. Since core portions of the formed spherical microstructures may be formed by the mediation of hydrophobic interaction, a hydrophobic substance may also be added. Non-limitative examples include drugs, physiologically active substances, dyes, and pigments which are hydrophobic.

Through irradiation of the aforementioned photosensitive composition with light, the photo-crosslinked structure of the present invention can be produced. When the photosensitive composition in the solution form is irradiated with light, in the case where the composition contains no surfactant, a photo-crosslinked structure having a particle size of 2 nm to 5 μm (as determined through dynamic light scattering) is produced, and in the case where the composition contains a surfactant, a photo-crosslinked structure having a particle size of 2 nm to 10 μm (as determined through dynamic light scattering) is produced. Such photo-crosslinked structures are characterized in that the particle size of spherical microstructures before irradiation is maintained. Even though conditions such as change in concentration are varied, the particle size is not varied.

Another embodiment of the photo-crosslinked structure of the present invention is a photo-crosslinked structure (resin film) fixed on a surface of a substrate, which structure is formed through applying a photosensitive composition onto a substrate, followed by light irradiation. In the photo-crosslinked structure of the present invention, the employed photosensitive composition is conceived to be crosslinked while the structural feature thereof is maintained. Such a photo-crosslinked structure is conceived to have a higher order structure in which spherical microstructures serve as crosslinking points, differing from an almost uniform network structure formed through conventional photo-curing and gelling.

The photo-crosslinked structure of the present invention has a very hydrophilic surface. Such high hydrophilicity may be attributable to the strucure in which hydrophobic photosensitive units consistently form a core through association, and hydrophilic polyethylene glycol chains surround the core, whereby hydrophobic portions do not expose to the surface. Therefore, the photo-crosslinked structure of the present invention may be employed, for example, for imparting hydrophilicity to a substrate surface.

One exemplary method for determining static contact angle serving as a hydrophilicity index is a method employing a static contact angle meter (FT Å 125, product of First Ten Å ngstroms). In the method, water drops (about 2 μL) are added dropwise onto a surface of the photo-crosslinked structure in air at 25° C. and a relative humidity of 50%, and contact angle between water and the substrate is measured eight seconds after placing water on the surface. The photo-crosslinked structure surface preferably has a contact angle with respect to water of 35° or less, more preferably 20° C. or less.

No particular limitation is imposed on the shape and material of the substrate. Examples of the substrate material include glass, thermoplastic resin, thermosetting resin, silicon, diamond, metal, and ceramic. Of these, glass and thermoplastic resin are particularly preferred. When a glass substrate is used, polyethylene glycol chains serving as backbones form, for example, a complex with alkali metal present on the surface of the glass substrate, whereby the photo-crosslinked structure is firmly fixed to the substrate. When a thermoplastic substrate is employed, radicals formed through irradiation with light of photosensitive functional groups contained in the photosensitive resin extract hydrogen or another element in the resin substrate, thereby forming covalent bonds, whereby the photo-crosslinked structure is firmly fixed to the substrate. Examples of the shape of the substrate include sheet, warped sheet, fiber, substrates having a microporous surface, capillary, and tube. Of these, sheet is particularly preferred, since sheet is suitable for forming a patterned structure by use of a mask. Alternatively, a surface-modified substrate may also be employed. For example, a glass substrate having a surface onto which an alkyl group or an amino group is introduced by use of a silane coupling agent or the like may be employed. When the photosensitive group of the photosensitive resin is an azido group, nitrene groups formed through light irradiation serve as radical-like species, the photo-crosslinked structure being firmly fixed to the substrate.

When a surface of the substrate is stained, higher order aggregation of spherical microstructures may tend to occur. In order to prevent aggregation of spherical microstructures, the surface of the substrate may be washed arbitrarily. A glass substrate may be washed through a known method such as washing with organic solvent, aqueous alkaline solution, aqueous hydrofluoric acid solution, or similar solution (wet method) and washing with compressed air, ozone, plasma, or a similar dry medium (dry method).

The photosensitive composition of the present invention can be crosslinked not only through light but also through heat. However, since heating at 100° C. or higher is required to cause thermal crosslinking, crosslinking of the photosensitive composition of the present invention is preferably performed through light irradiation.

The photo-crosslinked structure of the present invention can be fixed to a substrate through the following steps: applying a photosensitive composition onto a substrate to form a photosensitive composition coating film; irradiating the photosensitive composition coating film with light to form a photo-crosslinked structure; and optionally developing with water or an aqueous developer to form a photo-crosslinked structure.

No particular limitation is imposed on the thickness of the photosensitive composition coated on the substrate, so long as the composition can be applied to the substrate. The thickness is preferably 5 nm to 10 μm. When the thickness is less than 5 nm, formation of uniform film is difficult to confirm, whereas when a film having a thickness in excess of 10 μm is formed, viscosity of the photosensitive composition solution must be increased, which may cause problems in the coating step. Needless to say, the thickness may be modified to a value falling outside the above range, if the above problems are taken into consideration.

After application of the photosensitive composition on the substrate, the composition may be heated in accordance with needs. No particular limitation is imposed on the conditions of heating. Generally, heating is performed at about 30 to 150° C. for about one minute to 10 hours, preferably at about 35° C. to 120° C. for about three minutes to one hour.

The entire surface of the photosensitive composition coated on the substrate may be irradiated with light. Alternatively, the composition may be exposed to light in a desired pattern. When patternwise exposure is performed, unexposed portions are removed through developing after light irradiation, whereby a photo-crosslinked structure having an arbitrary pattern can be obtained.

The patternwise exposure may be performed through a mask. In order to form a pattern of interest, a mask having a negative desired pattern or a mask having a positive desired pattern may be employed.

No particular limitation is imposed on the light source for exposure, so long as the light source provides light interacting the photosensitive resin. Examples of the light source include X-ray, electron beam, excimer lasers (e.g., $F_2$, ArF, or KrF laser), and high-pressure mercury lamps. Energy of exposure may be appropriately predetermined in accordance with the structure of a photosensitive functional group or energy of the light source. Generally, energy of exposure is preferably 0.1 mJ/cm$^2$ to 100 J/cm$^2$, particularly preferably 100 mJ/cm$^2$ to 10 J/cm$^2$.

When complete exposure is performed, the exposed composition may be heated and washed with water, in accordance with needs. Generally, heating is performed at about 30 to 150° C. for about one minute to ten hours, preferably about 35 to 120° C. for about three minutes to one hour. In the case of patternwise exposure, after physical properties of the photosensitive composition coating film have been changed, heating and developing may be performed in accordance with needs. The conditions under which heating is performed are the same as employed in the complete exposure.

No particular limitation is imposed on the developer employed in developing, so long as the developer exhibits sufficiently different dissolution capabilities with respect to an unexposed region and an exposed region. Examples of employable solvents which can dissolve an unexposed region of the photosensitive composition coating film include water and a mixture of water and an organic solvent compatible with water. Non-limitative examples of the organic solvent compatible with water include ketones such as acetone; alcohols such as methanol; acetonitrile; and tetrahydrofuran. Through employment of any of these solvents, a considerably excellent pattern with no development residue can be suitably formed. The developer may be a mixture solution as mentioned above. No particular limitation is imposed on the mixed developer concentration so long as the developer can dissolve the unexposed region. For example, when the developer is water-methanol mixture, the methanol concentration may be adjusted from a level higher than 0 to a level lower than 100%.

Development may be performed through immersing an object to be developed after exposure in a developer; applying or spraying a developer onto an object to be developed; or a similar method. After formation of a pattern through development, the pattern may be rinsed, dried, or subjected to another process, in accordance with needs.

The photo-crosslinked structure fixed on a substrate according to the present invention is suitably employed under any circumstances including a dry state, a humidified state, and solution. The photo-crosslinked structure can satisfactorily maintain the structure thereof both in a dry state and a humidified state, and can consistently maintain the structure thereof at about 37° C. in an organic solvent, in water, or in an aqueous solution for a long period of time (e.g., one day or longer or 10 days or longer). The property that the photo-crosslinked structure is stable in a solution, particularly in water or an organic solvent compatible with water is important for use the structure particularly in a medical device or a similar device. Since a surface of such a device is often placed in a dry state or exposed to an aqueous solution or an organic solution, the photo-crosslinked structure must be resistant to any of the above conditions.

No particular limitation is imposed on the organic solvent compatible with water so long as the solvent is a solution containing water. Examples of the organic solvent compatible with water include a mixture of water and an organic solvent compatible with water (e.g., ketones such as acetone; alcohols such as methanol; acetonitrile, and tetrahydrofuran); buffers such as aqueous potassium dihydrogenphosphate-disodium hydrogenphosphate solution and aqueous sodium hydrogencarbonate-sodium carbonate solution; aqueous solutions of inorganic and organic salts such as sodium chloride, potassium chloride, and ammonium chloride; aqueous saccharide solutions containing monosaccharide or polysaccharide such as glucose, galactose, glucose, starch, heparin, or heparan sulfate; aqueous protein solutions, aqueous DNA or RNA solutions, liquid culture media, and mixtures thereof.

The solution may further contain a material which is not dissolved but dispersed in water or the organic solvent compatible with water. Non-limitative examples of the material include minerals such as clay, metal nano-particles such as gold nano-particles, polymer micro-particles such as polystyrene beads and latex particles, animal cells, plant cells, microorganisms, viruses, and mixtures thereof.

No particular limitation is imposed on the temperature at which the photo-crosslinked structure according to the present invention can be employed, so long as the photo-crosslinked structure or the photo-crosslinked structure-substrate composite does not lose stability. The photo-crosslinked structure is preferably employed at 4° C. to 80° C., more preferably 10 to 60° C. When the temperature is lower than 4° C., a portion of water is frozen, thereby possibly impairing stability of the photo-crosslinked structure or the composite, whereas when the temperature is higher than 80° C., photosentive groups or other groups of the photosensitive resin are decomposed, thereby possibly failing to maintain the structure of the composite.

EXAMPLES

The present invention will next be described by way of Examples, which should not be construed as limiting the present invention thereto.

Example 1

Synthesis of Photosensitive Resin A

Polyethylene glycol-diamine (product of Nippon Oil & Fats Co., Ltd., number average molecular weight of 1,000) (7.9 g), the aforementioned photo-functional compound 4 (10.0 g, which is 2.0 equivalents by mole of amine groups of polyethylene glycol-diamine), tetrahydrofuran (THF) (70 g) were mixed, and the mixture was allowed to react at 25° C. for 18 hours. After completion of reaction, THF was removed under reduced pressure. Subsequently, the reaction mixture was partitioned and extracted with water (50 g) and ethyl acetate (50 g). After removal of the organic layer, another aliquot (50 g) of ethyl acetate was added, and partition/extraction was repeated. After the mixture had been allowed to stand, the mixture was separated into three phases. The thus-obtained lowest oil layer was lyophilized, to thereby yield 7.2 g of photosensitive resin A represented by formula (a) below (n=23). The thus-produced photosensitive resin A was identified through $^1$H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 95%.

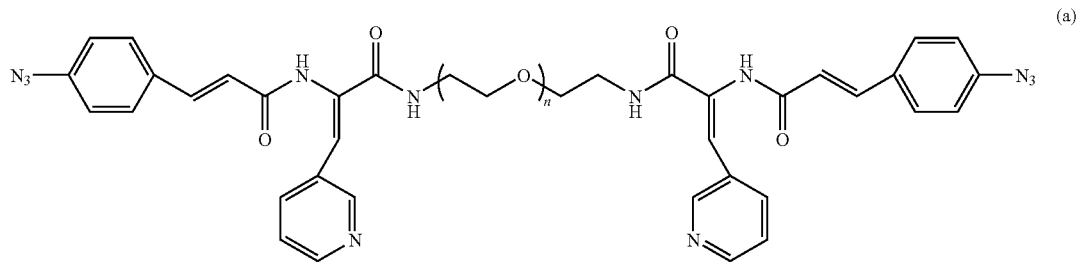

(a)

Example 2

Synthesis of Photosensitive Resin B

The procedure of Example 1 was repeated, except that polyethylene glycol-diamine (product of Nippon Oil & Fats Co., Ltd., number average molecular weight of 1,000) (13.1 g) and the aforementioned photo-functional compound 4 (10.0 g, which is 1.2 equivalents by mole of amine groups of polyethylene glycol-diamine) were used, to thereby yield 13.2 g of photosensitive resin B represented by the above formula (a) (n=23). The thus-produced photosensitive resin B was identified through $^1$H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 72%.

Example 3

Synthesis of Photosensitive Resin C

The procedure of Example 1 was repeated, except that polyethylene glycol-diamine (product of Nippon Oil & Fats Co., Ltd., number average molecular weight of 2,000) (7.9 g) and the aforementioned photo-functional compound 4 (6.0 g, which is 2.4 equivalents by mole of amine groups of polyethylene glycol-diamine) were used. In partition/extraction, the aqueous phase was washed twice with an organic phase, and the washed aqueous phase was lyophilized, to thereby yield 7.0 g of photosensitive resin C represented by the above formula (a) (n=45). The thus-produced photosensitive resin C was identified through ¹H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 96%.

Example 4

Synthesis of Photosensitive resin D

The procedure of Example 3 was repeated, except that polyethylene glycol-diamine (product of Nippon Oil & Fats Co., Ltd., number average molecular weight of 2,000) (15.8 g) and the aforementioned photo-functional compound 4 (6.0 g, which is 1.2 equivalents by mole of amine groups of polyethylene glycol-diamine) were used, to thereby yield 19.8 g of photosensitive resin D represented by the above formula (a) (n=45). The thus-produced photosensitive resin D was identified through ¹H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 83%.

Example 5

Synthesis of Photosensitive Resin E

The procedure of Example 3 was repeated, except that polyethylene glycol-dipropylamine (product of Wako Pure Chemical Industries, Ltd., number average molecular weight of 9,000 to 10,000) (23.7 g), the aforementioned photo-functional compound 4 (4.0 g, which is 2.4 equivalents by mole of amine groups of polyethylene glycol-dipropylamine), tetrahydrofuran (65 g), and acetonitrile (65 g) were mixed, to thereby yield 23.2 g of photosensitive resin E represented by formula (b) below (n=216). The thus-produced photosensitive resin E was identified through ¹H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 90%.

Example 6

Synthesis of Photosensitive Resin F

The procedure of Example 5 was repeated, except that polyethylene glycol-dipropylamine (product of Wako Pure Chemical Industries, Ltd., number average molecular weight of 9,000 to 10,000) (23.7 g) and the aforementioned photo-functional compound 4 (2.0 g, which is 1.2 equivalents by mole of amine groups of polyethylene glycol-dipropylamine), were used, to thereby yield 22.1 g of photosensitive resin F represented by the above formula (b) (n=216). The thus-produced photosensitive resin F was identified through ¹H-NMR on the basis of a proton peak attributed to methylene chains of polyethylene oxide (3.5 ppm) and proton peaks attributed to aromatic rings of photo-functional compound 4 (6.8 ppm to 8.7 ppm) The percent introduction of photo-functional compound 4, as calculated from the ratio between integral peak intensities, was 74%.

Example 7

Synthesis of Photosensitive Resin G

The procedure of Example 3 was repeated, except that polyethylene glycol-diamine (product of Nippon Oil & Fats Co., Ltd., number average molecular weight of 2,000) (17.2 g) and the aforementioned photo-functional compound 3 (6.0 g, which is 1.2 equivalents by mole of amine groups of polyethylene glycol-diamine) were used, to thereby yield 19.7 g of photosensitive resin G represented by formula (c) below (n=45). The thus-produced photosensitive resin G was identified through ¹H-NMR on the basis of a proton peak attributed to methylene chains of polyethylene oxide (3.5 ppm) and proton peaks attributed to aromatic rings of photo-functional compound 3 (6.8 ppm to 8.7 ppm). The percent introduction of photo-functional compound 3, as calculated from the ratio between integral peak intensities, was 70%.

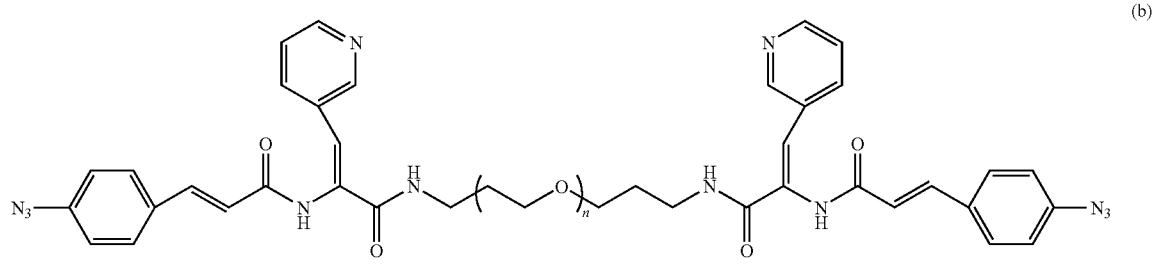

(b)

$n = 216$

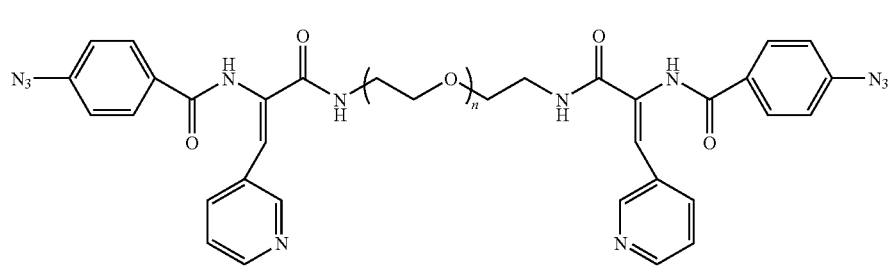

(c)

Example 8

Synthesis of Photosensitive Resin H

The procedure of Example 3 was repeated, except that polyethylene glycol-diamine (product of Nippon Oil & Fats Co., Ltd., number average molecular weight of 2,000) (15.1 g) and the aforementioned photo-functional compound 6 (6.0 g, which is 1.2 equivalents by mole of amine groups of polyethylene glycol-diamine) were used, to thereby yield 18.4 g of photosensitive resin H represented by formula (d) below (n=45). The thus-produced photosensitive resin H was identified through $^1$H-NMR on the basis of a proton peak attributed to methylene chains of polyethylene oxide (3.5 ppm) and proton peaks attributed to aromatic rings of photo-functional compound 6 (6.8 ppm to 8.7 ppm). The percent introduction of photo-functional compound 6, as calculated from the ratio between integral peak intensities, was 71%.

Example 9

Synthesis of Photosensitive Resin I

The procedure of Example 3 was repeated, except that polyethylene glycol-diamine (product of Nippon Oil & Fats Co., Ltd., number average molecular weight of 2,000) (15.2 g) and the aforementioned photo-functional compound 5 (6.0 g, which is 1.2 equivalents by mole of amine groups of polyethylene glycol-diamine) were used, to thereby yield 18.8 g of photosensitive resin I represented by formula (e) below (n=45). The thus-produced photosensitive resin H was identified through $^1$H-NMR on the basis of a proton peak attributed to methylene chains of polyethylene oxide (3.5 ppm) and proton peaks attributed to aromatic rings of photo-functional compound 5 (6.8 ppm to 8.7 ppm). The percent introduction of photo-functional compound 5, as calculated from the ratio between integral peak intensities, was 78%.

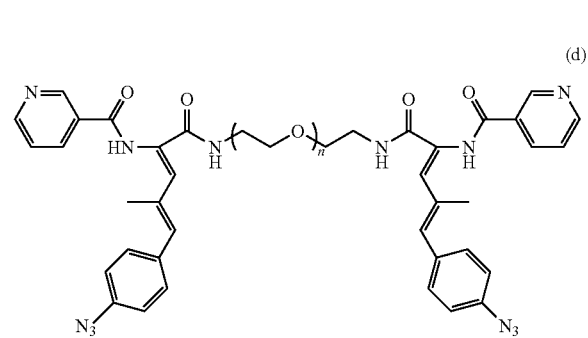

(d)

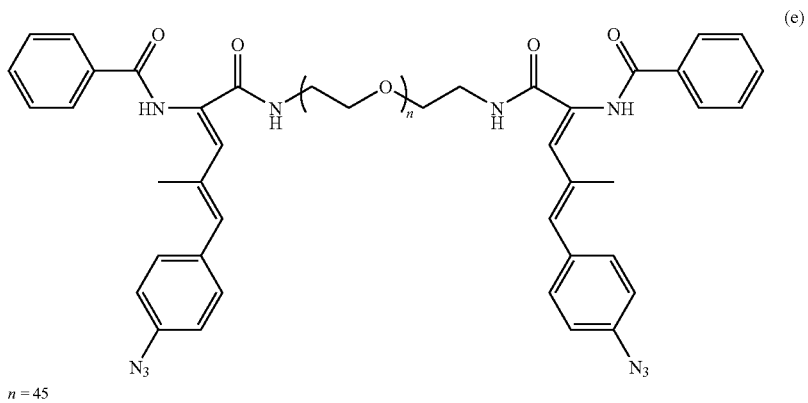

(e)

n = 45

Example 10

Synthesis of Photosensitive Resin J

The procedure of Example 3 was repeated, except that polyethylene glycol-diamine (product of Nippon Oil & Fats Co., Ltd., number average molecular weight of 2,000) (17.2 g) and the aforementioned photo-functional compound 1 (6.0 g, which is 1.2 equivalents by mole of amine groups of polyethylene glycol-diamine) were used, to thereby yield 21.5 g of photosensitive resin J represented by formula (f) below (n=45). The thus-produced photosensitive resin J was identified through $^1$H-NMR on the basis of a proton peak attributed to methylene chains of polyethylene oxide (3.5 ppm) and proton peaks attributed to aromatic rings of photo-functional compound 1 (6.8 ppm to 8.7 ppm). The percent introduction of photo-functional compound 1, as calculated from the ratio between integral peak intensities, was 81%.

functional compound 4 (2.0 g, which is 2.5 equivalents by mole of amine groups of Jeffamine EDR-148), and tetrahydrofuran (20 g) were mixed, and the mixture was allowed to react at 25° C. for 18 hours. After completion of reaction, THF was removed under reduced pressure. Subsequently, the reaction mixture was partitioned and extracted with water (20 g) and ethyl acetate (20 g). A solid matter formed during partition/extraction was collected through filtration and dried under reduced pressure at 45° C. for 18 hours, to thereby yield 0.81 g of photosensitive resin K represented by formula (g) below. The thus-produced photosensitive resin K was identified through $^1$H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 90%.

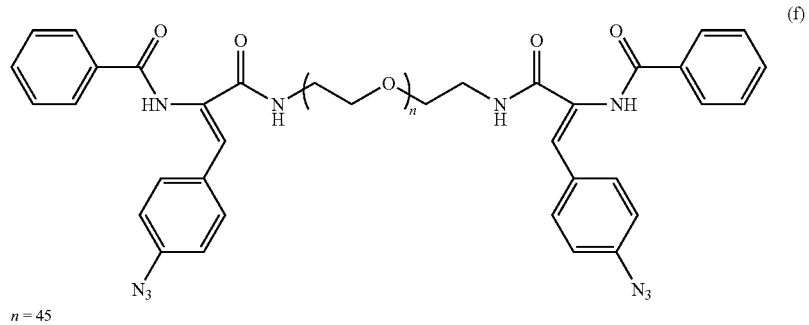

(f)

$n = 45$

Comparative Example 1

Synthesis of Photosensitive Resin K

Jeffamine EDR-148 (product of Huntsman Corporation, number average molecular weight of 148) represented by the following formula (7) (0.19 g), the aforementioned photo-

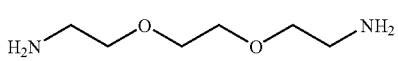

(7)

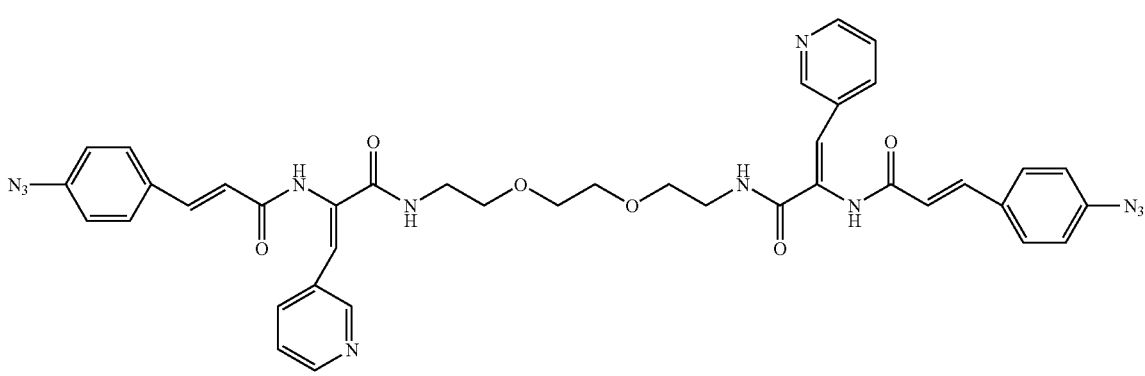

(g)

Comparative Example 2

Synthesis of Photosensitive Resin L

The procedure of Comparative Example 1 was repeated, except that Jeffamine HK-511 (product of Huntsman Corporation, number average molecular weight of 220) represented by the following formula (8) (0.28 g) was used instead of Jeffamine EDR-148, to thereby yield 0.86 g of photosensitive resin L represented by formula (h) below. The thus-produced photosensitive resin L was identified through $^1$H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 92%.

Example 13

Preparation of Photosensitive Compositions III

The procedure of example 12 was repeated, except that photosensitive resin D produced in Example 4 was used instead of photosensitive resin C, to thereby prepare solutions having concentrations shown in Table 2. The thus-produced aqueous solutions were filtered through a 0.2-μm filter, to thereby yield photosensitive compositions III-1 to III-7.

Example 14

Preparation of Photosensitive Compositions IV

The procedure of example 12 was repeated, except that photosensitive resin E produced in Example 5 was used instead of photosensitive resin C, to thereby prepare solutions having concentrations shown in Table 2. The thus-produced

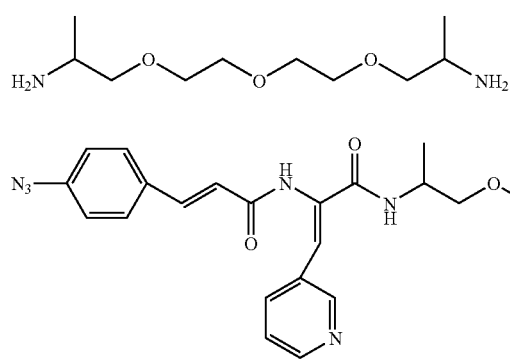

(8)

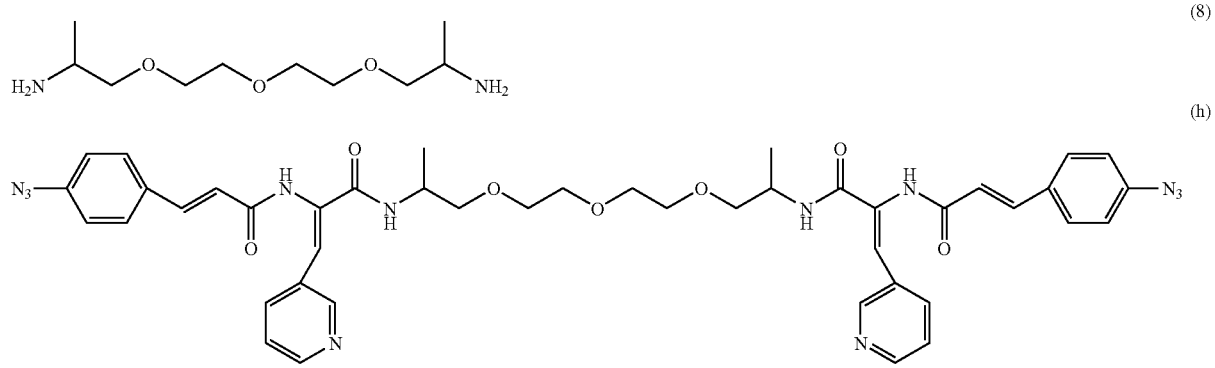

(h)

Example 11

Preparation of Photosensitive Compositions I

The photosensitive resin A produced in Example 1 was dissolved in water whose pH was regulated with hydrochloric acid to a pH value shown in Table 2, to thereby prepare solutions having concentrations shown in Table 2. The thus-produced aqueous solutions were filtered through a 0.2-μm cellulose acetate membrane filter (hereinafter referred to simply as "filter"), to thereby yield photosensitive compositions I-1 to I-6.

Example 12

Preparation of Photosensitive Compositions II

The photosensitive resin C produced in Example 3 was dissolved in water whose pH was regulated with hydrochloric acid or sodium hydroxide to a pH value shown in Table 2, to thereby prepare solutions having concentrations shown in Table 2. The thus-produced aqueous solutions were filtered through a 0.2-μm filter, to thereby yield photosensitive compositions II-1 to II-7.

aqueous solutions were filtered through a 0.2-μm filter, to thereby yield photosensitive compositions IV-1 to IV-7.

Example 15

Preparation of photosensitive compositions V

The photosensitive resin G produced in Example 7 was dissolved in pure water, to thereby prepare 5 wt. % aqueous solution. The thus-produced aqueous solution was filtered through 0.2-μm filter, to thereby yield photosensitive composition V.

Example 16

Preparation of Photosensitive Compositions VI

The photosensitive resin H produced in Example 8 was dissolved in pure water, to thereby prepare 5 wt. % aqueous solution. The thus-produced aqueous solution was filtered through 0.2-μm filter, to thereby yield photosensitive composition VI.

Example 17

Preparation of Photosensitive Compositions VII to IX

The photosensitive resin C produced in Example 3 was dissolved in water-methanol (80:20 by weight, for preparation of photosensitive composition VII), water-methanol (50:

50 by weight, for preparation of photosensitive composition VIII), or water-methanol (20:80 by weight, for preparation of photosensitive composition IX), to thereby yield the corresponding 5 wt. % solutions. The thus-yielded solutions were filtered through a 0.2-μm filter, to thereby yield photosensitive compositions VII to IX.

Example 18

Preparation of Photosensitive Compositions X to XIV

The photosensitive resin C produced in Example 3 was dissolved in methanol (for preparation of photosensitive composition X), acetone (for preparation of photosensitive composition XI), acetonitrile (for preparation of photosensitive composition XII), tetrahydrofuran (for preparation of photosensitive composition XIII), or toluene (for preparation of photosensitive composition XIV), to thereby yield the corresponding 5 wt. % solutions. The thus-obtained solutions were filtered through a 0.2-μm filter, to thereby yield photosensitive compositions X to XIV.

Comparative Example 3

Preparation of Photosensitive Compositions XV

The photosensitive resin K produced in Comparative Example 1 was mixed with water whose pH was regulated with hydrochloric acid to 1 (for preparation of photosensitive composition XV-1) or THF (for preparation of photosensitive composition XV-2), to thereby yield liquids having a resin concentration shown in Table 3. The thus-obtained THF solution was filtered through a 0.2-μm filter, to thereby yield photosensitive composition XV-2. Since photosensitive resin K was not be dissolved in water having a pH of 1, the subsequent evaluation could not be performed.

Comparative Example 4

Preparation of Photosensitive Compositions XVI

The photosensitive resin L produced in Comparative Example 2 was dissolved in water whose pH was regulated with hydrochloric acid to 1 (for preparation of photosensitive composition XVI-1) or THF (for preparation of photosensitive composition XVI-2), to thereby yield solutions having a resin concentration shown in Table 3. The thus-obtained solutions were filtered through a 0.2-μm filter, to thereby yield photosensitive compositions XVI-1 and XVI-2.

Test Example 1

Particle Size Determination

Photosensitive compositions of Examples 11 to 18 and Comparative Examples 3 and 4 were subjected to dynamic light scattering (DLS) measurement by means of a dynamic light scattering measurement apparatus (HPPS Zetasizer Nano S, product of Malvern). The measurement conditions were 25° C. in air for 90 seconds, and the particle size was determined by averaging the measured DLS values. Tables 2 and 3 show the results.

As is clear from Tables 2 and 3, the photosensitive compositions of the above Examples and Comparative Examples form spherical microstructures having a particle size falling within a wide range of 5 nm to 2 μm or more. Most of the photosensitive compositions formed small spherical microstructures having a particle size of 5 nm to 20 nm and large spherical microstructures having a particle size of 100 nm to 2 μm or more, with a considerably wide particle size distribution profile. On the other hand, photosensitive compositions including II-3, II-4, III-3, and III-4, employing photosensitive compound C or D and having a pH of 7 and a solid content of 5 wt. % or lower, exhibited a sharp single particle size peak at 5 to 20 nm. Therefore, particle size and peak profile of spherical microstructures were found to be regulated by modifying strength of interaction (e.g., hydrophobic interaction) of photosensitive groups in a photosensitive resin, solvation stability of spherical microstructures depending on length of polyethylene glycol chains, or other factors.

TABLE 2

| | | Photo-sensitive resin | | | Particle size peak 1 | Particle size peak 2 | Particle size | Contact angle |
|---|---|---|---|---|---|---|---|---|
| | Composition | Type | wt. % | pH | (nm) | (nm) | distribution | (°) |
| Ex. 11 | I-1 | PS resin A | 1 | 1 | 31 | 162 | Multi-peak | 28 |
| | I-2 | PS resin A | 5 | 1 | 20 | 208 | Multi-peak | 26 |
| | I-3 | PS resin A | 10 | 1 | 162 | 1,285 | Multi-peak | 25 |
| | I-4 | PS resin A | 30 | 1 | 2,513 | — | Multi-peak | 26 |
| | I-5 | PS resin A | 1 | 3 | 179 | 2,586 | Multi-peak | 29 |
| | I-6 | PS resin A | 5 | 3 | 14 (15)*1 | — | Single peak | 30 |
| Ex. 12 | II-1 | PS resin C | 5 | 1 | 22 | 225 | Multi-peak | 18 |
| | II-2 | PS resin C | 5 | 3 | 26 | 223 | Multi-peak | 16 |
| | II-3 | PS resin C | 1 | 7 | 6 | — | Single peak | 11 |
| | II-4 | PS resin C | 5 | 7 | 14 (15)*2 | — | Single peak | 10 |
| | II-5 | PS resin C | 10 | 7 | 24 | 1,527 | Multi-peak | 12 |
| | II-6 | PS resin C | 30 | 7 | 2,400 | — | Multi-peak | 12 |
| | II-7 | PS resin C | 5 | 9 | 15 | — | Single peak | 10 |
| Ex. 13 | III-1 | PS resin D | 5 | 1 | 23 | 238 | Multi-peak | 19 |
| | III-2 | PS resin D | 5 | 3 | 28 | 224 | Multi-peak | 14 |
| | III-3 | PS resin D | 1 | 7 | 7 | — | Single peak | 11 |
| | III-4 | PS resin D | 5 | 7 | 17 | — | Single peak | 10 |
| | III-5 | PS resin D | 10 | 7 | 23 | 759 | Multi-peak | 12 |

TABLE 2-continued

|  | Composition | Photo-sensitive resin Type | wt. % | pH | Particle size peak 1 (nm) | Particle size peak 2 (nm) | Particle size distribution | Contact angle (°) |
|---|---|---|---|---|---|---|---|---|
|  | III-6 | PS resin D | 30 | 7 | 2,512 | — | Multi-peak | 11 |
|  | III-7 | PS resin D | 5 | 9 | 16 | — | Single peak | 11 |
| Ex. 14 | IV-1 | PS resin E | 5 | 1 | 6 | 366 | Multi-peak | 12 |
|  | IV-2 | PS resin E | 5 | 3 | 5 | 335 | Multi-peak | 11 |
|  | IV-3 | PS resin E | 1 | 7 | 7 | 257 | Multi-peak | 13 |
|  | IV-4 | PS resin E | 5 | 7 | 6 | 395 | Multi-peak | 12 |
|  | IV-5 | PS resin E | 10 | 7 | 6 | 654 | Multi-peak | 14 |
|  | IV-6 | PS resin E | 30 | 7 | 31 | 2,671 | Multi-peak | 14 |
|  | IV-7 | PS resin E | 5 | 9 | 6 | 446 | Multi-peak | 16 |
| Ex. 15 | V | PS resin G | 5 | 7 | 16 | — | Single peak | 16 |
| Ex. 16 | VI | PS resin H | 5 | 7 | 12 | — | Single peak | 14 |

PS: photo-sensitive
*[1] Value in ( ) obtained in Ex. 19
*[2] Value in ( ) obtained in Ex. 20

TABLE 3

|  | Composition | Photo-sensitive resin Type | wt. % | Solvent | Particle size peak 1 (nm) | Particle size peak 2 (nm) | Particle size distribution | Contact angle (°) |
|---|---|---|---|---|---|---|---|---|
| Ex. 17 | VII | PS resin C | 5 | water:methanol = 80:20 | 14 | 82 | Multi-peak | 18 |
|  | VIII | PS resin C | 5 | water:methanol = 50:50 | 10 | 45 | Multi-peak | 20 |
|  | IX | PS resin C | 5 | water:methanol = 20:80 | 6 | 24 | Multi-peak | 19 |
| Ex. 18 | X | PS resin C | 5 | methanol | 5 | 42 | Multi-peak | 21 |
|  | XI | PS resin C | 5 | acetone | 8 | 84 | Multi-peak | 20 |
|  | XII | PS resin C | 5 | acetonitrile | 10 | 128 | Multi-peak | 24 |
|  | XIII | PS resin C | 5 | tetrahydrofuran | 12 | 254 | Multi-peak | 22 |
|  | XIV | PS resin C | 5 | toluene | 2,600 | — | Multi-peak | 28 |
| Comp. Ex. 3 | XV-1 | PS resin K | 0.2 | HCl aq. (pH 1) | — | — | — | — |
|  | XV-2 | PS resin K | 1 | THF | 2,280 | — | Multi-peak | 89 |
| Comp. Ex. 4 | XVI-1 | PS resin L | 0.2 | HCl aq. (pH 1) | 2,420 | — | Multi-peak | 50 |
|  | XVI-2 | PS resin L | 1 | THF | 2,136 | — | Multi-peak | 92 |

PS: photo-sensitive

Example 19

Formation of Microgel (Photo-Crosslinked Structure) through Irradiation of Photosensitive Composition I The photosensitive composition I-6 (2 mL) prepared in Example 11 was added dropwise to a 100-mL beaker (diameter: about 54 mm), and the entirety composition was irradiated with light from a high-pressure mercury lamp (exposure amount: 100 to 750 mJ/cm$^2$). After exposure, the solution was diluted with hydrochloric acid-water (pH 3, 10 mL), and the solution was lyophilized. The lyophilized product was diluted with hydrochloric acid-water (pH 3) so as to prepare solutions having solid contents of 0.1 wt. %, 1 wt. %, 10 wt. %, and 20 wt. %, respectively. DLS measurement of the thus-prepared solutions revealed that these solutions maintained a particle size equivalent to that of an unexposed solution (I-6, solid content: 5 wt. %, in Table 2). On the basis of the results, formation of microgel was confirmed.

Example 20

Formation of Microgel (Photo-Crosslinked Structure) through Irradiation of Photosensitive Composition II The photosensitive composition II-4 (2 mL) prepared in Example 12 was added dropwise to a 100-mL beaker (diameter: about 54 mm), and the entirety composition was irradiated with light from a high-pressure mercury lamp (exposure amount: 100 to 750 mJ/cm$^2$). After exposure, the solution was diluted with pure water (10 mL), and the solution was lyophilized. The lyophilized product was diluted with pure water so as to prepare solutions having solid contents of 0.1 wt. %, 1 wt. %, 10 wt. %, and 20 wt. %, respectively. DLS measurement of the thus-prepared solutions revealed that these solutions maintained a particle size equivalent to that of an unexposed solution (II-4, solid content: 5 wt. %, in Table 2). On the basis of the results, formation of microgel was confirmed.

Example 21

Photo-Crosslinked Structures Produced from Photosensitive Compositions I

A slide made of soda-lime glass (product of Matsunami Glass Ind. Ltd., hereinafter referred to simply as "non-coat glass slide") was employed as a substrate. Photosensitive composition I-2 was added dropwise onto the non-coat glass slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 22

The procedure of Example 21 was repeated, except that photosensitive composition I-6 was used instead of photosensitive composition I-2, to thereby form a photo-crosslinked structure fixed on the substrate through photo-crosslinking.

Example 23

The procedure of Example 21 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 24

The procedure of Example 22 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 25

The procedure of Example 22 was repeated, except that the composition was irradiated with light through a mask so as to provide a line/space (100 μm/200 μm) pattern, to thereby form a photo-crosslinked structure having a line/space (100 μm/200 μm) surface pattern and fixed on the substrate through photo-crosslinking.

Example 26

The procedure of Example 22 was repeated, except that the slide made of soda-lime glass had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 27

The procedure of Example 26 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 28

The procedure of Example 22 was repeated, except that the slide made of soda-lime glass had been immersed in an aqueous alkaline solution (pure water : isopropyl alcohol sodium hydroxide=93:5:2 (proportions by weight)) for two minutes for washing, rinsed with pure water, and dried with nitrogen, prior to employment as a substrate, to thereby form a photo-crosslinked structure having a surface pattern including holes and fixed on the substrate through photo-crosslinking.

Example 29

The procedure of Example 28 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 30

A slide made of aminosilane-coated glass (surface-modified with amino groups, product of Matsunami Glass Ind. Ltd., hereinafter referred to simply as "APS-coated glass slide") was employed as a substrate. Photosensitive composition I-7 was added dropwise onto the APS-coated glass slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 31

The procedure of Example 30 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 32

A slide made of Permanox Plastic (cell culture slide 160005, product of Nunc, hereinafter referred to simply as "Permanox slide") was employed as a substrate. Photosensitive composition I-7 was added dropwise onto the Permanox slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 33

A slide made of a plastic substrate whose surface has been modified with amino groups (microarray slide, black, aminosilane-coated polymer slide for microarray, product of Nunc, hereinafter referred to simply as "amino-modified slide") was employed as a substrate. Photosensitive composition I-7 was added dropwise onto the amino-modified slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm²). The film was washed in water at 25° C. for one minute and dried at 60° C. for 10 minutes, to thereby form a photo-crosslinked structure fixed on the substrate through photo-crosslinking.

Example 34

Photo-Crosslinked Structures Produced from Photosensitive Compositions II

The procedure of Example 21 was repeated, except that photosensitive composition II-1 was used instead of photosensitive composition I-2, to thereby form a photo-crosslinked structure fixed on the substrate through photo-crosslinking.

Example 35

The procedure of Example 21 was repeated, except that photosensitive composition II-2 was used instead of photosensitive composition I-2, to thereby form a photo-crosslinked structure fixed on the substrate through photo-crosslinking.

Example 36

The procedure of Example 21 was repeated, except that photosensitive composition II-3 was used instead of photosensitive composition I-2, to thereby form a photo-crosslinked structure fixed on the substrate through photo-crosslinking.

Example 37

The procedure of Example 21 was repeated, except that photosensitive composition II-4 was used instead of photosensitive composition I-2, to thereby form a photo-crosslinked structure fixed on the substrate through photo-crosslinking.

Example 38

The procedure of Example 21 was repeated, except that photosensitive composition II-5 was used instead of photosensitive composition I-2, to thereby form a photo-crosslinked structure fixed on the substrate through photo-crosslinking.

Example 39

The procedure of Example 21 was repeated, except that photosensitive composition II-7 was used instead of photosensitive composition I-2, to thereby form a photo-crosslinked structure fixed on the substrate through photo-crosslinking.

Example 40

The procedure of Example 37 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 41

The procedure of Example 37 was repeated, except that the composition was irradiated with light through a mask so as to provide a line/space (100 μm/200 μm) pattern, to thereby form a photo-crosslinked structure having a line/space (100 μm/200 μm) surface pattern and fixed on the substrate through photo-crosslinking.

Example 42

The procedure of Example 37 was repeated, except that the slide made of soda-lime glass had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 43

The procedure of Example 42 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 44

The procedure of Example 30 was repeated, except that photosensitive composition II-4 was used instead of photosensitive composition I-7, to thereby form a photo-crosslinked structure fixed on the substrate through photo-crosslinking.

Example 45

The procedure of Example 32 was repeated, except that photosensitive composition II-4 was used instead of photosensitive composition I-7, to thereby form a photo-crosslinked structure fixed on the substrate through photo-crosslinking.

Example 46

Photo-Crosslinked Structures Produced from Photosensitive Compositions III

The procedure of Example 21 was repeated, except that photosensitive composition III-1 was used instead of photosensitive composition I-2, to thereby form a photo-crosslinked structure fixed on the substrate through photo-crosslinking.

Example 47

The procedure of Example 21 was repeated, except that photosensitive composition III-2 was used instead of photosensitive composition I-2, to thereby form a photo-crosslinked structure fixed on the substrate through photo-crosslinking.

Example 48

The procedure of Example 21 was repeated, except that photosensitive composition III-3 was used instead of photosensitive composition I-2, to thereby form a photo-crosslinked structure fixed on the substrate through photo-crosslinking.

Example 49

The procedure of Example 21 was repeated, except that photosensitive composition III-4 was used instead of photosensitive composition I-2, to thereby form a photo-crosslinked structure fixed on the substrate through photo-crosslinking.

Example 50

The procedure of Example 21 was repeated, except that photosensitive composition III-5 was used instead of photosensitive composition I-2, to thereby form a photo-crosslinked structure fixed on the substrate through photo-crosslinking.

Example 51

The procedure of Example 21 was repeated, except that photosensitive composition III-7 was used instead of photosensitive composition I-2, to thereby form a photo-crosslinked structure fixed on the substrate through photo-crosslinking.

Example 52

The procedure of Example 49 was repeated, except that the composition was irradiated with light through a mask so as to provide a pattern including a plurality of holes each having a diameter of 100 µm, to thereby form a photo-crosslinked structure having a surface pattern including holes and fixed on the substrate through photo-crosslinking.

Example 53

The procedure of Example 49 was repeated, except that the composition was irradiated with light through a mask so as to provide a line/space (100 µm/200 µm) pattern, to thereby form a photo-crosslinked structure having a line/space (100 µm/200 µm) surface pattern and fixed on the substrate through photo-crosslinking.

Example 54

The procedure of Example 49 was repeated, except that the slide made of soda-lime glass had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 55

The procedure of Example 54 was repeated, except that the composition was irradiated with light through a mask so as to provide a pattern including a plurality of holes each having a diameter of 100 µm, to thereby form a photo-crosslinked structure having a surface pattern including holes and fixed on the substrate through photo-crosslinking.

Example 56

The procedure of Example 30 was repeated, except that photosensitive composition III-4 was used instead of photosensitive composition I-7, to thereby form a photo-crosslinked structure fixed on the substrate through photo-crosslinking.

Example 57

The procedure of Example 32 was repeated, except that photosensitive composition III-4 was used instead of photosensitive composition I-7, to thereby form a photo-crosslinked structure fixed on the substrate through photo-crosslinking.

Example 58

Photo-Crosslinked Structures Produced from Photosensitive Compositions IV

The procedure of Example 21 was repeated, except that photosensitive composition IV-1 was used instead of photosensitive composition I-2, to thereby form a photo-crosslinked structure fixed on the substrate through photo-crosslinking.

Example 59

The procedure of Example 21 was repeated, except that photosensitive composition IV-2 was used instead of photosensitive composition I-2, to thereby form a photo-crosslinked structure fixed on the substrate through photo-crosslinking.

Example 60

The procedure of Example 21 was repeated, except that photosensitive composition IV-3 was used instead of photosensitive composition I-2, to thereby form a photo-crosslinked structure fixed on the substrate through photo-crosslinking.

Example 61

The procedure of Example 21 was repeated, except that photosensitive composition IV-4 was used instead of photosensitive composition I-2, to thereby form a photo-crosslinked structure fixed on the substrate through photo-crosslinking.

Example 62

The procedure of Example 21 was repeated, except that photosensitive composition IV-5 was used instead of photosensitive composition I-2, to thereby form a photo-crosslinked structure fixed on the substrate through photo-crosslinking.

Example 63

The procedure of Example 21 was repeated, except that photosensitive composition IV-7 was used instead of photosensitive composition I-2, to thereby form a photo-crosslinked structure fixed on the substrate through photo-crosslinking.

Example 64

The procedure of Example 61 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 65

The procedure of Example 61 was repeated, except that the composition was irradiated with light through a mask so as to provide a line/space (100 μm/200 μm) pattern, to thereby form a photo-crosslinked structure having a line/space (100 μm/200 μm) surface pattern and fixed on the substrate through photo-crosslinking.

Example 66

The procedure of Example 61 was repeated, except that the slide made of soda-lime glass had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 67

The procedure of Example 66 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 68

Photo-Crosslinked Structures Produced from Photosensitive Compositions V to XIV

The procedure of Example 21 was repeated, except that photosensitive compositions V to XIV were used instead of photosensitive composition I-2, to thereby form photo-crosslinked structures fixed on respective substrates through photo-crosslinking.

Comparative Example 5

Photo-Crosslinked Structures Produced from Photosensitive Compositions XV and XVI The procedure of Example 21 was repeated, except that photosensitive composition XV or XVI was used instead of photosensitive composition I-2, to thereby form photo-crosslinked structures fixed on respective substrates through photo-crosslinking.

Test Example 2

Determination of Static Contact Angle between Water and a Surface of Photo-Crosslinked Structure Among the photo-crosslinked structures produced in Examples 21 to 68 and Comparative Example 5, those obtained through complete exposure were measured in terms of static contact angle between water and a surface of each photo-crosslinked structure by means of a static contact angle meter (FT Å 125, product of First Ten Å ngstroms) in air at 25° C. and a relative humidity of 50%. In the above measurement, water drops (about 2 μL) were added onto each photo-crosslinked structure fixed on a substrate, and the contact angle between water and the surface was measured eight seconds after addition of water. Tables 2 and 3 show the results. The photo-crosslinked structure produced from photosensitive composition I was found to have a surface exhibiting a contact angle of about 250 to 300, and photosensitive compositions evaluated in other Examples were found to have a surface exhibiting a contact angle of about 50 to 200. Thus, each of these photo-crosslinked structures has a very hydrophilic surface.

In contrast, a photo-crosslinked structure produced in Comparative Example 5 from the tetrahydrofuran solution was found to have a surface exhibiting a contact angle of about 90°, indicating that the surface was very hydrophobic. The photo-crosslinked structure produced in Comparative Example 5 from the aqueous solution (pH: 1) was found to have a surface exhibiting a contact angle of about 50°, which failed to exhibit sufficient hydrophilicity.

Test Example 3

Solvent Exposure Test of Photo-Crosslinked Structures

Figure 1B:
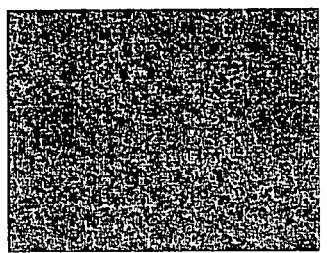
Figure 1C:
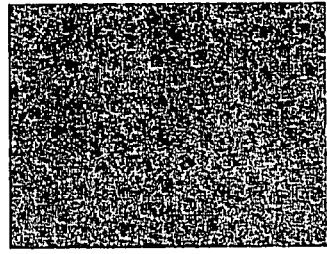
Figure 1D:
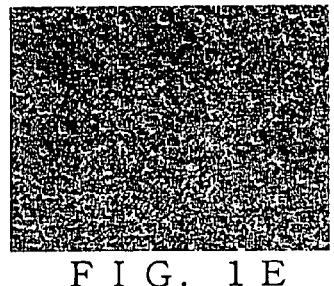
Figure 1E:
Figure 1F:
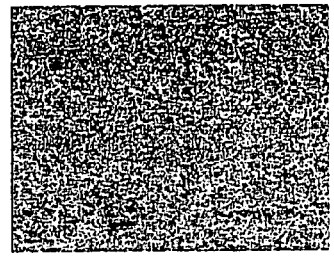

Each of the photo-crosslinked structures produced in Examples 21 to 68 was immersed at 25° C. or 37° C. in water, in an organic solvent compatible with water, or in an organic solvent. Three days and 10 days after the start of immersion, the shape of the photo-crosslinked structure and stability to off-substrate exfoliation of the photo-crosslinked structure were evaluated. The solvents employed were pure water, dihydrogen monopotassium phosphate-monohydrogen disodium phosphate (phosphate buffer, pH: 7.4), 10% aqueous acetone solution, 5% aqueous sodium dodecyl sulfate solution, 10% fetal calf serum-containing Dulbecco's modified Eagle's medium (product of Nissui Pharmaceutical Co., Ltd.), and acetone. When the solvent was water or phosphate buffer, immersion at 60° C. was also performed, and the shape of the photo-crosslinked structure-substrate was observed three days and 10 days after the start of immersion. As exemplary surface condition of photo-crosslinked structures, FIGS. 1A to 1F show surfaces of photo-crosslinked structures of Examples 26 and 43 (immersed in phosphate buffer at 37° C. and acetone at 25° C., respectively) before and after immersion.

The photo-crosslinked structures produced in Examples 21 to 68, except those produced from photosensitive composition XIV, were stable before and after performance of the immersion test in a variety of solvents. Specifically, the structures exhibited no change in surface condition, no off-substrate exfoliation of photo-crosslinked structures which would otherwise be caused by swelling, and no breakage.

The photo-crosslinked structure produced from photosensitive composition XIV was stable and exhibited no off-substrate exfoliation of photo-crosslinked structures which would otherwise be caused by swelling, and no breakage during three days after immersion. However, 10 days after immersion, a portion of the structure was peeled off the substrate due to reduced adhesion, although the shape of the film was maintained. Since photosensitive composition XIV employes non-polar toluene as a solvent, large spherical microstructures are formed in the solution. However, differing from spherical microstructures formed in water, a polar solvent, or a mixture thereof, the photo-crosslinked structure produced from photosensitive composition XIV is conceived to have reduced adhesion with respect to the substrate. Therefore, it has been confirmed that, when a photo-crosslinked structure fixed to a substrate is used in solvent, a photo-crosslinked structure prepared from a photosensitive composition employing water, a polar solvent, or a mixture thereof is preferably used.

The surface of the photo-crosslinked film of the invention exhibited variation in color tone. The variation is attributable to change in macroscopic morphology of the resin film caused by higher-order aggregation or phase separation. Therefore, differing from a photo-crosslinked film having a uniform network structure, the photo-crosslinked structure of the present invention has been confirmed to have a structure in which spherical microstructures are cross-linked.

Example 69

Preparation of Photosensitive Compositions 1

The photosensitive compound A produced in Example 1, one-end laurylated polyethylene glycol (oxyethylene units=20, product name: Pegnol L-20S, product of Toho Chemical Industry Co., Ltd.) serving as a surfactant, and both-end stearylated polyethylene glycol (molecular weight: 6000, product name: Pegnol PDS-60A, product of Toho Chemical Industry Co., Ltd.) serving as a surfactant were mixed with water whose pH was regulated with hydrochloric acid to 3, so as to attain the compositional proportions shown in Table 4, whereby liquids each having a total solid content of 5 wt. % were prepared. The thus-produced aqueous solutions were filtered through a 0.2-μm cellulose acetate membrane filter (hereinafter referred to simply as "filter"), to thereby yield photosensitive compositions 1-1 to 1-5.

Example 70

Preparation of Photosensitive Composition 2

The procedure of Example 69 was repeated, except that photosensitive compound C produced in Example 3 and pure water were used instead of the aforementioned photosensitive compound A and water whose pH was regulated to 3, respectively, so as to attain the compositional proportions shown in Table 4. The thus-produced aqueous solutions were filtered through a 0.2-μm filter, to thereby yield photosensitive compositions 2-1 to 2-5.

Example 71

Preparation of Photosensitive Composition 3

The procedure of Example 70 was repeated, except that photosensitive compound E produced in Example 5 was used instead of the aforementioned photosensitive compound C, so as to attain the compositional proportions shown in Table 4. The thus-produced aqueous solutions were filtered through a 0.2-μm filter, to thereby yield photosensitive compositions 3-1 to 3-5.

Example 72

Preparation of Photosensitive Composition 4

The procedure of Example 70 was repeated, except that photosensitive compound G produced in Example 7 was used instead of the aforementioned photosensitive compound C, so as to attain the compositional proportions shown in Table 4. The thus-produced aqueous solutions were filtered through a 0.2-μm filter, to thereby yield photosensitive compositions 4-1 to 4-5.

Example 73

Preparation of Photosensitive Composition 5

The procedure of Example 70 was repeated, except that photosensitive compound H produced in Example 8 was used instead of the aforementioned photosensitive compound C, so as to attain the compositional proportions shown in Table 4. The thus-produced aqueous solutions were filtered through a 0.2-μm filter, to thereby yield photosensitive compositions 5-1 to 5-5.

Examples 74 to 76

Preparation of Photosensitive Compositions 6 to 8

The procedure of Example 70 (2-3) was repeated, except that water-methanol (80:20 by weight, for preparation of photosensitive composition 6), water-methanol (50:50 by weight, for preparation of photosensitive composition 7), and water-methanol (20:80 by weight, for preparation of photosensitive composition 8) were used instead of pure water, so as to attain the compositional proportions shown in Table 5. The thus-produced aqueous solutions were filtered through a 0.2-μm filter, to thereby yield photosensitive compositions 6 to 8.

Example 77 to 81

Preparation of Photosensitive Compositions 9 to 13

The procedure of Example 70 (2-3) was repeated, except that methanol (for preparation of photosensitive composition 9), acetone (for preparation of photosensitive composition 10), acetonitrile (for preparation of photosensitive composition 11), tetrahydrofuran (for preparation of photosensitive composition 12), and toluene (for preparation of photosensitive composition 13) were used instead of pure water, so as to attain the compositional proportions shown in Table 5. The thus-obtained aqueous solutions were filtered through a 0.2-μm filter, to thereby yield photosensitive compositions 9 to 13.

Test Example 4

Particle Size Determination

Photosensitive compositions of Examples 69 to 81 were subjected to dynamic light scattering (DLS) measurement by means of a dynamic light scattering measurement apparatus (HPPS Zetasizer Nano S, product of Malvern). The measurement conditions were 25° C. in air for 90 seconds, and the particle size was determined by averaging the measured DLS values. Tables 4 and 5 show the results.

As is clear from Tables 4 and 5, the photosensitive compositions of the above Examples form spherical microstructures having a particle size falling within a wide range of 5 nm to 2 μm or more. Most of the photosensitive compositions formed small spherical microstructures having a particle size of 5 nm to 20 nm and large spherical microstructures having a particle size of 100 nm to 2 μm or more, with a considerably wide particle size distribution profile. On the other hand, the photosensitive compositions of 1-1, 2-1, and 3-1, which contain one-end laurylated polyethylene glycol exclusively forming single-peak micelles in an amount as high as 3.9 wt. %, and the photosensitive composition including 1-3 and 2-3, which contain a photosensitive compound having a polyethylene glycol chain length of 1,000 to 2,000 in an amount of 2.0 wt. % or less, which is conceived to effectively crosslink micelles, exhibited a very sharp single particle size peak only at about 10 nm. Therefore, particle size and peak profile of spherical microstructures were found to be regulated by modifying alkyl chain length of the surfactant, positions (one end and both ends) of the alkyl chain(s) in the surfactant, strength of interaction (e.g., hydrophobic interaction) of photosensitive groups in a photosensitive compound, solvation stability of spherical microstructures depending on length of polyethylene glycol chains, or other factors.

ated with light from a high-pressure mercury lamp (exposure amount: 100 to 750 mJ/cm$^2$). After exposure, the solution was diluted with hydrochloric acid-water (pH 3, 10 mL), and the solution was lyophilized. The lyophilized product was diluted with hydrochloric acid-water (pH 3) so as to prepare solutions having solid contents of 0.1 wt. %, 1 wt. %, 10 wt. %, and 20 wt. %, respectively. DLS measurement of the thus-prepared solutions revealed that these solutions maintained a particle size equivalent to that of an unexposed solution (1-5, solid content: 5 wt. %, in Table 4). On the basis of the results, formation of microgel was confirmed.

TABLE 4

| Composition | Photo-sensitive compound Type | Photo-sensitive compound wt. % | L-20S wt. % | PDS-60A wt. % | Particle size peak 1 (nm) | Particle size peak 2 (nm) | Particle size distribution | Contact angle (°) |
|---|---|---|---|---|---|---|---|---|
| 1-1 | PS compound A | 1.0 | 3.9 | 0.1 | 8 | — | Single peak | 31 |
| 1-2 | PS compound A | 1.0 | 3.6 | 0.4 | 10 | — | Single peak | 42 |
| 1-3 | PS compound A | 1.6 | 3.0 | 0.4 | 12 | — | Single peak | 40 |
| 1-4 | PS compound A | 1.8 | 3.0 | 0.2 | 13 | — | Single peak | 45 |
| 1-5 | PS compound A | 2.6 | 2.0 | 0.4 | 14 | 1,724 | Multi-peak | 34 |
| 2-1 | PS compound C | 1.0 | 3.9 | 0.1 | 9 | — | Single peak | 15 |
| 2-2 | PS compound C | 1.0 | 3.6 | 0.4 | 11 | — | Single peak | 27 |
| 2-3 | PS compound C | 1.6 | 3.0 | 0.4 | 12 | — | Single peak | 26 |
| 2-4 | PS compound C | 1.8 | 3.0 | 0.2 | 11 | — | Single peak | 28 |
| 2-5 | PS compound C | 2.6 | 2.0 | 0.4 | 15 | 1,429 | Multi-peak | 19 |
| 3-1 | PS compound E | 1.0 | 3.9 | 0.1 | 9 | — | Single peak | 18 |
| 3-2 | PS compound E | 1.0 | 3.6 | 0.4 | 11 | 131 | Multi-peak | 33 |
| 3-3 | PS compound E | 1.6 | 3.0 | 0.4 | 12 | 132 | Multi-peak | 32 |
| 3-4 | PS compound E | 1.8 | 3.0 | 0.2 | 11 | 410 | Multi-peak | 30 |
| 3-5 | PS compound E | 2.6 | 2.0 | 0.4 | 10 | 45 | Multi-peak | 25 |
| 4-1 | PS compound G | 1.0 | 3.9 | 0.1 | 11 | — | Single peak | 17 |
| 4-2 | PS compound G | 1.0 | 3.6 | 0.4 | 13 | — | Single peak | 31 |
| 4-3 | PS compound G | 1.6 | 3.0 | 0.4 | 15 | — | Single peak | 29 |
| 4-4 | PS compound G | 1.8 | 3.0 | 0.2 | 12 | — | Single peak | 33 |
| 4-5 | PS compound G | 2.6 | 2.0 | 0.4 | 18 | 2,183 | Multi-peak | 24 |
| 5-1 | PS compound H | 1.0 | 3.9 | 0.1 | 10 | — | Single peak | 18 |
| 5-2 | PS compound H | 1.0 | 3.6 | 0.4 | 12 | — | Single peak | 30 |
| 5-3 | PS compound H | 1.6 | 3.0 | 0.4 | 14 | — | Single peak | 27 |
| 5-4 | PS compound H | 1.8 | 3.0 | 0.2 | 13 | — | Single peak | 31 |
| 5-5 | PS compound H | 2.6 | 2.0 | 0.4 | 19 | 1,917 | Multi-peak | 22 |

PS: photo-sensitive

TABLE 5

| Composition | Photo-sensitive compound C wt. % | Solvent | L-20S wt. % | PDS-60A wt. % | Particle size peak 1 (nm) | Particle size peak 2 (nm) | Particle size distribution | Contact angle (°) |
|---|---|---|---|---|---|---|---|---|
| 6 | 1.6 | water:methanol = 80:20 | 3.0 | 0.4 | 14 | — | Single peak | 32 |
| 7 | 1.6 | water:methanol = 50:50 | 3.0 | 0.4 | 22 | 452 | Multi-peak | 35 |
| 8 | 1.6 | water:methanol = 20:80 | 3.0 | 0.4 | 27 | 681 | Multi-peak | 41 |
| 9 | 1.6 | methanol | 3.0 | 0.4 | 45 | 1,257 | Multi-peak | 44 |
| 10 | 1.6 | acetone | 3.0 | 0.4 | 41 | 1,854 | Multi-peak | 42 |
| 11 | 1.6 | acetonitrile | 3.0 | 0.4 | 45 | 1,483 | Multi-peak | 41 |
| 12 | 1.6 | tetrahydrofuran | 3.0 | 0.4 | 38 | 1,768 | Multi-peak | 40 |
| 13 | 1.6 | toluene | 3.0 | 0.4 | 451 | 2,132 | Multi-peak | 45 |

Example 82

Formation of Microgel (Photo-Crosslinked Structure) through Irradiation of PhotosensitiveComposition The photosensitive composition 1-5 (2 mL) prepared in Example 69 was added dropwise to a 100-mL beaker (diameter: about 54 mm), and the entirety composition was irradi- Example 83

Formation of Microgel (Photo-Crosslinked Structure) through Irradiation of Photosensitive Composition The photosensitive composition 2-5 (2 mL) prepared in Example 70 was added dropwise to a 100-mL beaker (diameter: about 54 mm), and the entirety composition was irradiated with light from a high-pressure mercury lamp (exposure amount: 100 to 750 mJ/cm$^2$). After exposure, the solution was diluted with pure water (10 mL), and the solution was lyophilized. The lyophilized product was diluted with pure water so as to prepare solutions having solid contents of 0.1 wt. %, 1 wt. %, 10 wt. %, and 20 wt. %, respectively. DLS measurement of the thus-prepared solutions revealed that these solutions maintained a particle size equivalent to that of an unexposed solution (2-5, solid content: 5 wt. %, in Table 4). On the basis of the results, formation of microgel was confirmed.

Example 84

Photo-Crosslinked Structures (on Substrate) Produced from Photosensitive Compositions 1

A slide made of soda-lime glass (product of Matsunami Glass Ind. Ltd., hereinafter referred to simply as "non-coat glass slide") was employed as a substrate. Photosensitive composition 1-2 was added dropwise onto the non-coat glass slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 85

The procedure of Example 84 was repeated, except that photosensitive composition 1-5 was used instead of photosensitive composition 1-2, to thereby form a photo-crosslinked structure fixed on the substrate through photo-crosslinking.

Example 86

The procedure of Example 84 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 87

The procedure of Example 85 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 88

The procedure of Example 85 was repeated, except that the composition was irradiated with light through a mask so as to provide a line/space (100 Mm/200 μm) pattern, to thereby form a photo-crosslinked structure having a line/space (100 μm/200 μm) surface pattern and fixed on the substrate through photo-crosslinking.

Example 89

The procedure of Example 85 was repeated, except that the non-coat glass slide had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 90

The procedure of Example 89 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 91

The procedure of Example 85 was repeated, except that the non-coat glass slide had been immersed in an aqueous alkaline solution (pure water : isopropyl alcohol : sodium hydroxide=93:5:2 (proportions by weight)) for two minutes for washing, rinsed with pure water, and dried with nitrogen, prior to employment as a substrate, to thereby form a photo-crosslinked structure fixed on the substrate through photo-crosslinking.

Example 92

The procedure of Example 91 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 93

A slide made of aminosilane-coated glass (surface-modified with amino groups, product of Matsunami Glass Ind. Ltd., hereinafter referred to simply as "APS-coated glass slide") was employed as a substrate. Photosensitive composition 1-5 was added dropwise onto the APS-coated glass slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 94

The procedure of Example 93 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 95

A slide made of Permanox Plastic (cell culture slide 160005, product of Nunc, hereinafter referred to simply as "Permanox slide") was employed as a substrate. Photosensitive composition 1-5 was added dropwise onto the Permanox slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 96

A slide made of a plastic substrate whose surface has been modified with amino groups (microarray slide, black, aminosilane-coated polymer slide for microarray, product of Nunc, hereinafter referred to simply as "amino-modified slide") was employed as a substrate. Photosensitive composition 1-5 was added dropwise onto the amino-modified slide, and film of the composition was formed through spin-coating (1,000 rpm×30 seconds). The film was dried at 60° C. for 10 minutes, followed by cooling to room temperature. Subsequently, the entirety film was irradiated with light from a high-pressure mercury lamp (exposure amount: 1,000 mJ/cm$^2$). The film was washed in water at 25° C. for one minute and dried at 60° C. for 10 minutes, to thereby form a photo-crosslinked structure fixed on the substrate through photo-crosslinking.

Example 97

Photo-Crosslinked Structures (on Substrate) Produced from Photosensitive Compositions 2

The procedure of Example 85 was repeated, except that photosensitive composition 2-1 was used instead of photosensitive composition 1-5, to thereby form a photo-crosslinked structure fixed on the substrate through photo-crosslinking.

Example 98

The procedure of Example 85 was repeated, except that photosensitive composition 2-2 was used instead of photosensitive composition 1-5, to thereby form a photo-crosslinked structure fixed on the substrate through photo-crosslinking.

Example 99

The procedure of Example 85 was repeated, except that photosensitive composition 2-3 was used instead of photosensitive composition 1-5; to thereby form a photo-crosslinked structure fixed on the substrate through photo-crosslinking.

Example 100

The procedure of Example 85 was repeated, except that photosensitive composition 2-4 was used instead of photosensitive composition 1-5, to thereby form a photo-crosslinked structure fixed on the substrate through photo-crosslinking.

Example 101

The procedure of Example 85 was repeated, except that photosensitive composition 2-5 was used instead of photosensitive composition 1-5, to thereby form a photo-crosslinked structure fixed on the substrate through photo-crosslinking.

Example 102

The procedure of Example 101 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 103

The procedure of Example 101 was repeated, except that the composition was irradiated with light through a mask so as to provide a line/space (100 μm/200 μm) pattern, to thereby form a photo-crosslinked structure having a line/space (100 μm/200 μm) surface pattern and fixed on the substrate through photo-crosslinking.

Example 104

The procedure of Example 101 was repeated, except that the non-coat glass slide had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 105

The procedure of Example 104 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 106

Photo-Crosslinked Structures (on Substrate) Produced from Photosensitive Compositions 3

The procedure of Example 85 was repeated, except that photosensitive composition 3-1 was used instead of photosensitive composition 1-5, to thereby form a photo-crosslinked structure fixed on the substrate through photo-crosslinking.

Example 107

The procedure of Example 85 was repeated, except that photosensitive composition 3-2 was used instead of photosensitive composition 1-5, to thereby form a photo-crosslinked structure fixed on the substrate through photo-crosslinking.

Example 108

The procedure of Example 85 was repeated, except that photosensitive composition 3-3 was used instead of photosensitive composition 1-5, to thereby form a photo-crosslinked structure fixed on the substrate through photo-crosslinking.

Example 109

The procedure of Example 85 was repeated, except that photosensitive composition 3-4 was used instead of photosensitive composition 1-5, to thereby form a photo-crosslinked structure fixed on the substrate through photo-crosslinking.

Example 110

The procedure of Example 85 was repeated, except that photosensitive composition 3-5 was used instead of photosensitive composition 1-5, to thereby form a photo-crosslinked structure fixed on the substrate through photo-crosslinking.

Example 111

The procedure of Example 109 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 112

The procedure of Example 109 was repeated, except that the composition was irradiated with light through a mask so as to provide a line/space (100 μm/200 μm) pattern, to thereby form a photo-crosslinked structure having a line/space (100 μm/200 μm) surface pattern and fixed on the substrate through photo-crosslinking.

Example 113

The procedure of Example 109 was repeated, except that the non-coat glass slide had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 114

The procedure of Example 113 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 115

The procedure of Example 93 was repeated, except that photosensitive composition 3-4 was used instead of photosensitive composition 1-5, to thereby form a photo-crosslinked structure fixed on the substrate through photo-crosslinking.

Example 116

The procedure of Example 95 was repeated, except that photosensitive composition 3-4 was used instead of photosensitive composition 1-5, to thereby form a photo-crosslinked structure fixed on the substrate through photo-crosslinking.

Example 117

Photo-Crosslinked Structures (on Substrate)
Produced from Photosensitive Compositions 4

The procedure of Example 85 was repeated, except that photosensitive composition 4-1 was used instead of photosensitive composition 1-5, to thereby form a photo-crosslinked structure fixed on the substrate through photo-crosslinking.

Example 118

The procedure of Example 85 was repeated, except that photosensitive composition 4-2 was used instead of photosensitive composition 1-5, to thereby form a photo-crosslinked structure fixed on the substrate through photo-crosslinking.

Example 119

The procedure of Example 85 was repeated, except that photosensitive composition 4-3 was used instead of photosensitive composition 1-5, to thereby form a photo-crosslinked structure fixed on the substrate through photo-crosslinking.

Example 120

The procedure of Example 85 was repeated, except that photosensitive composition 4-4 was used instead of photosensitive composition 1-5, to thereby form a photo-crosslinked structure fixed on the substrate through photo-crosslinking.

Example 121

The procedure of Example 85 was repeated, except that photosensitive composition 4-5 was used instead of photosensitive composition 1-5, to thereby form a photo-crosslinked structure fixed on the substrate through photo-crosslinking.

Example 122

The procedure of Example 120 was repeated, except that the composition was irradiated with light through a mask so as to provide a pattern including a plurality of holes each having a diameter of 100 μm, to thereby form a photo-crosslinked structure having a surface pattern including holes and fixed on the substrate through photo-crosslinking.

Example 123

The procedure of Example 120 was repeated, except that the composition was irradiated with light through a mask so as to provide a line/space (100 μm/200 μm) pattern, to thereby form a photo-crosslinked structure having a line/space (100 μm/200 μm) surface pattern and fixed on the substrate through photo-crosslinking.

Example 124

The procedure of Example 120 was repeated, except that the non-coat glass slide had been immersed in a 5-wt. % aqueous hydrofluoric acid solution for one minute for washing, rinsed with pure water, and dried with nitrogen, prior to employment as a substrate, to thereby form a photo-crosslinked structure fixed on the substrate through photo-crosslinking.

Example 125

The procedure of Example 124 was repeated, except that the composition was irradiated with light through a mask so as to provide a pattern including a plurality of holes each having a diameter of 100 µm, to thereby form a photo-crosslinked structure having a surface pattern including holes and fixed on the substrate through photo-crosslinking.

Examples 126 to 134

Photo-Crosslinked Structures (on Substrate) Produced from Photosensitive Compositions 5-5 and 6 to 8

The procedure of Example 85 was repeated, except that photosensitive compositions 5-5 and 6 to 8 were used instead of photosensitive composition 1-5, to thereby form photo-crosslinked structures fixed on respective substrates through photo-crosslinking.

Test Example 5

Determination of Static Contact Angle Between Water and a Surface of Photo-Crosslinked Structure Among the photo-crosslinked structure produced in Examples 84 to 134, those obtained through complete exposure were measured in terms of static contact angle between water and a surface of each photo-crosslinked structure by means of a static contact angle meter (FTA 125, product of First Ten Angstroms) in air at 25° C. and a relative humidity of 50%. In the above measurement, water drops (about 2 µL) were added onto each photo-crosslinked structure fixed on a substrate, and the contact angle between water and the surface was measured eight seconds after addition of water. Tables 4 and 5 show the results. The photo-crosslinked structure was found to have a surface exhibiting a contact angle of about 100 to 500. Thus, each of these photo-crosslinked structures has a very hydrophilic surface.

Test Example 6

Solvent Exposure Test of Photo-Crosslinked Structures

Figure 2A:
FIGS. 2A to 2D show surface conditions of some photo-crosslinked structure samples of the present invention before and after the solvent-exposure test.
Figure 2B:
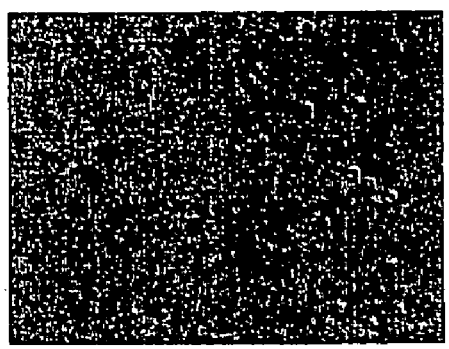
Figure 2C:
Figure 2D:
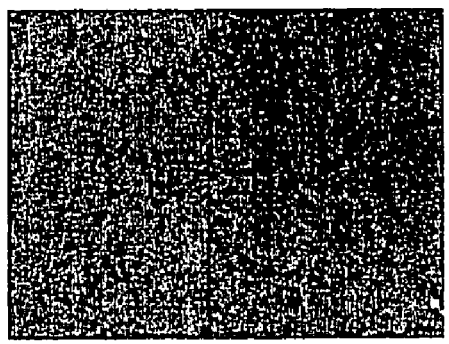

Each of the photo-crosslinked structure produced in Examples 84 to 134 was immersed at 25° C. or 37° C. in water, in an aqueous solvent, or in an organic solvent. Three days and 10 days after the start of immersion, the photo-crosslinked structure-substrate was observed so as to evaluate the shape of the photo-crosslinked structure and stability to off-substrate exfoliation of the photo-crosslinked structure in water, in an aqueous solvent, or in an organic solvent. The solvents employed were pure water, dihydrogen monopotassium phosphate-monohydrogen disodium phosphate (phosphate buffer, pH: 7.4), 10% aqueous acetone solution, 5% aqueous sodium dodecyl sulfate solution, 10% fetal calf serum-containing Dulbecco's modified Eagle's medium (product of Nissui Pharmaceutical Co., Ltd.), and acetone. When the solvent was water or phosphate buffer, immersion at 60° C. was also performed, and the shape of the photo-crosslinked structure-substrate was observed three days and 10 days after the start of immersion. As exemplary surface condition of photo-crosslinked structures, FIGS. 2A to 2D show surfaces of photo-crosslinked structures of Examples 85 and 101 (immersed in phosphate buffer at 37° C. and acetone at 25° C., respectively) before and after immersion.

The photo-crosslinked structures produced in Examples 84 to 134, except those produced from photosensitive composition 13 were stable before and after performance of the immersion test in a variety of solvents. Specifically, the structures exhibited no change in surface condition, no off-substrate exfoliation of photo-crosslinked structures which would otherwise be caused by swelling, and no breakage. The photo-crosslinked structure produced from photosensitive composition 13 was stable and exhibited no off-substrate exfoliation of photo-crosslinked structures which would otherwise be caused by swelling, and no breakage during three days after immersion. However, 10 days after immersion, a portion of the structure was peeled off the substrate due to reduced adhesion, although the shape of the film was maintained. Since photosensitive composition 13 employs non-polar toluene as a solvent, large spherical microstructures are formed in the solution. However, differing from spherical microstructures formed in water, a polar solvent, or a mixture thereof, the photo-crosslinked structure produced from photosensitive composition 13 is conceived to have reduced adhesion with respect to the substrate. Therefore, it has been confirmed that, when a photo-crosslinked structure fixed to a substrate is used in solvent, a photo-crosslinked structure prepared from a photosensitive composition employing water, a polar solvent, or a mixture thereof is preferably used.

The surfaces of the photo-crosslinked structures of Examples 84 to 134 exhibited variation in color tone. The variation is attributable to change in macroscopic morphology of the resin film caused by higher-order aggregation or phase separation. Therefore, differing from a conventional photo-crosslinked film having a uniform network structure, the photo-crosslinked structure of the present invention has been confirmed to have a structure in which spherical microstructures are cross-linked.

Example 135

Synthesis of Photosensitive Resin M

The procedure of Example 3 was repeated, except that the polymer represented by formula (9) below (n=45, number average molecular weight of 2,000) (15.8 g) was used instead of polyethylene glycol-diamine, to thereby yield 19.2 g of photosensitive resin M represented by formula (i) below (n=45). The thus-produced photosensitive resin M was identified through $^1$H-NMR on the basis of a proton peak attributed to methylene chains of polyethylene oxide (3.5 ppm) and proton peaks attributed to aromatic rings of photo-functional compound 4 (6.8 ppm to 8.7 ppm). The percent introduction of photo-functional compound 4, as calculated from the ratio between integral peak intensities, was 80%.

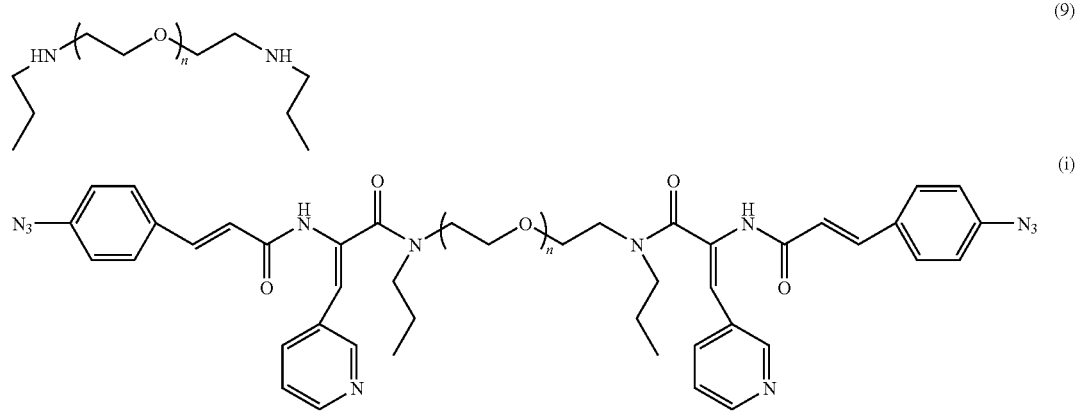

Example 136

Preparation of Photosensitive Compositions XVII

The photosensitive resin M produced in Example 135 was dissolved in water whose pH was regulated with hydrochloric acid or sodium hydroxide to a pH value shown in Table 6, to thereby prepare solutions having concentrations shown in Table 6. The thus-produced aqueous solutions were filtered through a 0.2-μm filter, to thereby yield photosensitive compositions XVII-1 to XVII-7.

Example 137

The procedure of Example 21 was repeated, except that photosensitive composition XVII-5 was used instead of photosensitive composition I-2, to thereby form a photo-crosslinked structure fixed on the substrate through photo-crosslinking. The thus-produced photo-crosslinked structure was subjected to solvent exposure test in a manner similar to that employed in Test Example 3. The photo-crosslinked structure was stable before and after performance of the immersion test. Specifically, the structure exhibited no change in surface condition, no off-substrate exfoliation of photo-crosslinked structure which would otherwise be caused by swelling, and no breakage.

TABLE 6

|  | Composition | Photo-sensitive resin Type | wt. % | pH |
|---|---|---|---|---|
| Ex. 136 | XVII-1 | PS resin M | 5 | 1 |
|  | XVII-2 | PS resin M | 5 | 3 |
|  | XVII-3 | PS resin M | 1 | 7 |
|  | XVII-4 | PS resin M | 5 | 7 |
|  | XVII-5 | PS resin M | 10 | 7 |
|  | XVII-6 | PS resin M | 30 | 7 |
|  | XVII-7 | PS resin M | 5 | 9 |

PS: photo-sensitive

What is claimed is:

1. A photosensitive resin represented by the following formula (1):

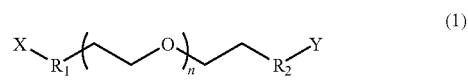

wherein n represents a mean polymerization degree and is 5 or more; $R_1$ and $R_2$, which may be identical to or different from each other, each represent an alkylene group, an arylene group, an oxyalkylene group, or a single bond; each of X and Y represents a photosensitive unit represented by the following formula (2):

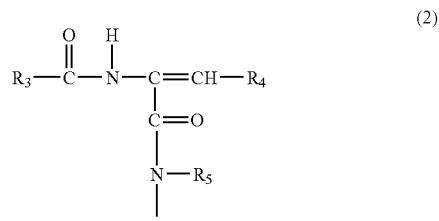

or either one of X and Y represents a photosensitive unit represented by the above formula (2) and the other represents an amino group; $R_3$ represents a group selected from among the groups represented by the following formula set (3):

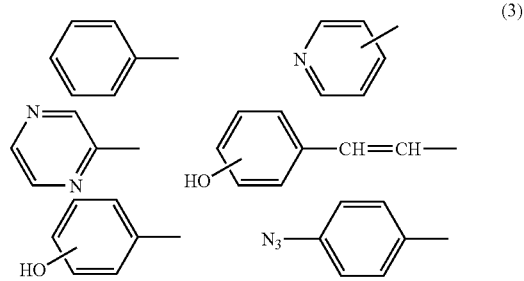

-continued

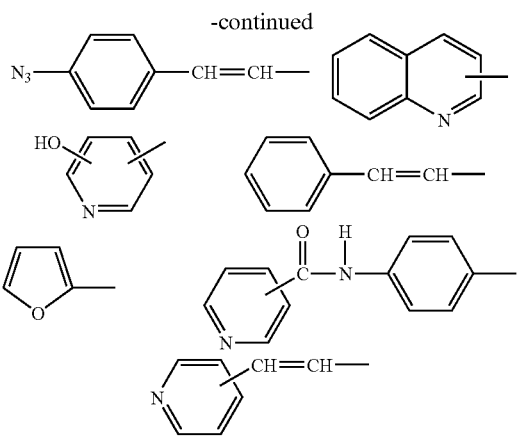

$R_4$ represents a group selected from among the groups represented by the following formula set (4):

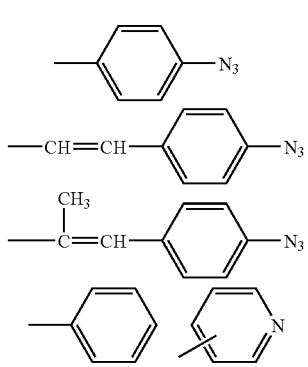

(4)

-continued

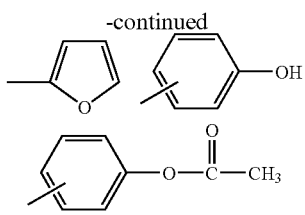

at least one of $R_3$ and $R_4$ has at least one azido group; and $R_5$ represents a hydrogen atom, an alkyl group, an acetal-group-containing alkyl group, an aryl group, an aralkyl group, or a substituent containing a base-forming nitrogen atom.

2. The photosensitive resin as described in claim 1, wherein each of $R_1$ and $R_2$ represents a methylene group or a single bond, X and Y represent the same photosensitive unit represented by the aforementioned formula (2), $R_3$ represents a group represented by the following formula (5), and $R_4$ represents a group represented by the following formula (6):

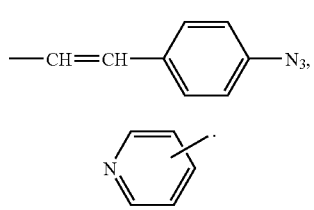

(5)

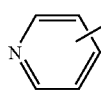

(6)

3. The photosensitive resin as described in claim 1, wherein the mean polymerization degree n is 20 to 230.

* * * * *

UNITED STATES PATENT AND TRADEMARK OFFICE
CERTIFICATE OF CORRECTION

| | | |
|---|---|---|
| PATENT NO. | : 7,605,191 B2 | Page 1 of 1 |
| APPLICATION NO. | : 11/393678 | |
| DATED | : October 20, 2009 | |
| INVENTOR(S) | : Ikeya et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 590 days.

Signed and Sealed this

Fourteenth Day of December, 2010

David J. Kappos
*Director of the United States Patent and Trademark Office*